United States Patent [19]
Andoh

[11] Patent Number: 6,022,757
[45] Date of Patent: Feb. 8, 2000

[54] SEMICONDUCTOR DEVICE AND MANUFACTURING METHOD

[75] Inventor: Mamoru Andoh, Moriguchi, Japan

[73] Assignee: Sanyo Electric Co., Ltd., Osaka, Japan

[21] Appl. No.: 09/045,074

[22] Filed: Mar. 20, 1998

[30] Foreign Application Priority Data

Mar. 28, 1997 [JP] Japan ................................. 9-078309
Aug. 25, 1997 [JP] Japan ................................. 9-228329

[51] Int. Cl.[7] .................................................. H01L 21/40
[52] U.S. Cl. ..................... 438/106; 438/107; 438/121; 438/125
[58] Field of Search .................................. 438/106, 107, 438/118, 119, 121–127

[56] References Cited

U.S. PATENT DOCUMENTS

| | | | |
|---|---|---|---|
| 5,143,865 | 9/1992 | Hideshima et al. | 438/614 |
| 5,629,241 | 5/1997 | Matloubian et al. | 438/125 |
| 5,786,230 | 7/1998 | Anderson et al. | 438/122 |
| 5,786,636 | 7/1998 | Takahashi | 438/107 |
| 5,866,443 | 2/1999 | Pogge et al. | 438/106 |

FOREIGN PATENT DOCUMENTS

| | | |
|---|---|---|
| 3-248551 | 11/1991 | Japan . |
| 5-129473 | 5/1993 | Japan . |
| 06338504 | 12/1994 | Japan . |
| 7-38334 | 2/1995 | Japan . |

*Primary Examiner*—Kevin M. Picardat
*Attorney, Agent, or Firm*—Cantor Colburn LLP

[57] ABSTRACT

A semiconductor device with advanced functions and an improved factor of effective mounting area comprises a semiconductor chip on which an IC or the like is formed; a plurality of external connector electrodes having a block form which are connected with a plurality of electrodes of the semiconductor chip, arranged near the circumference of the semiconductor chip at a prescribed distance from the semiconductor chip, and composed of a substrate other than the semiconductor chip; a wiring substrate which is arranged face to face with the semiconductor chip and the external connector electrodes, and a wiring pattern for electrically connecting each electrode of the semiconductor chip with the external connector electrodes is formed on the surface. Connectors connect the wiring pattern with both electrodes of the semiconductor chip and external connector electrodes and form a prescribed space between the wiring substrate and the semiconductor chip. A method of manufacturing such devices is also disclosed.

19 Claims, 23 Drawing Sheets

SEMICONDUCTOR DEVICE AND MANUFACTURING METHOD

BACKGROUND OF THE INVENTION

1. Field of the Invention

The present invention relates to a semiconductor device and method of manufacturing this semiconductor device. This device has an improved factor of effective mounting area, which represents the ratio of chip area of the semiconductor device to occupation area of the semiconductor device as actually mounted on a mounting substrate, such as a printed circuit board.

2. Description of the Related Art

A common semiconductor in which an element, such as a bipolar IC or a MOSLSI, is formed on a silicon substrate may have a constitution as shown in FIG. 1, where numeral 1 represents a silicon substrate, numeral 2 represents an island such as a cooling wheel on which the silicon substrate 1 is mounted, numeral 3 represents lead terminals, and numeral 4 represents a sealing resin mold.

As described above, the silicon substrate 1 on which a bipolar IC is formed is firmly mounted on the island 2, such as, a cooling wheel mainly including a copper by a soldering material 5, such as solder as shown in FIG. 1. The lead terminals 3 arranged on the peripheries of the silicon substrate 1 and each electrode of the bipolar IC or the like are electrically connected by wire bonding. The silicon substrate and portions of the lead terminals are completely coated with thermohardening resin 4, such as epoxy resin, by transfer molding. A resin molding type semiconductor device is thereby provided.

A semiconductor device molded with resin is normally mounted on a wiring substrate, such as a glass epoxy substrate. The semiconductor device is then electrically connected with other semiconductor devices and circuit elements mounted on a mounting substrate, and is used as a component for performing a prescribed circuit operation.

A mounting area of a mounting substrate 30 on which a semiconductor device 20 is mounted is represented by a region enclosed by lead terminals 21, 22, and 23 and a conductive pad to be connected with these lead terminals, as shown in FIG. 2. The mounting area is larger than the area of the silicon substrate (semiconductor chip) in the semiconductor device 20, but the majority of the mounting area is occupied by mold resin and lead terminals. The area of the semiconductor chip accounts for only a small percent of the mounting area.

If the ratio of a formation area of the semiconductor chip to the mounting area is designated as a "factor of effective area", it can be shown that this factor of effective area is extremely small in a semiconductor device molded by resin. If the factor of effective area is small, when the semiconductor device 20 which is connected with other circuit elements installed on the wiring substrate 30 is used, most of the mounting area will be dead space, which is not relevant to the chip's functions. The dead space on the mounting substrate will also be large as described above, thereby limiting density miniaturization of the mounting substrate 30.

This problem is especially remarkable in a semiconductor device of small package size. For example, if the package of a semiconductor chip is as shown in FIG. 3, the minimum size 3.4 mm ×2.4 mm, and the semiconductor chip is wired with metal lead terminals and then molded by resin, the overall size of the semiconductor device will be approximately 6.0 mm×5.0 mm. The area of the chip of the semiconductor device will be 8.16 $mm^2$, and the mounting area of the semiconductor will be 30.0 $mm^2$. Thus, the factor of effective area of the semiconductor device will be approximately 27.2 percent, even though leads are ignored (when leads are taken into consideration, the value will be smaller.). Most of the mounting area will be a dead space.

In common consumer electronic devices such as, for example a portable digital assistants, 8 mm video cameras, portable telephones, cameras, and liquid crystal televisions, miniaturization of the body of such equipment requires the miniaturization of the mounting substrate.

However, in the resin sealing type semiconductor device described above, the dead space accounts for a large percent of the mounting area of the semiconductor device. This limits the miniaturization of mounting substrate, and results in this dead space being one of the factors preventing electronic devices from being miniaturized.

Japanese Patent Laid-Open Publication No. Hei 3-248551 discloses one method of improving the factor of effective area, as is shown in FIG. 4. In this method, in order to reduce the mounting area as much as possible when a resin mold type semiconductor device is mounted on a mounting substrate or the like, lead terminals 41, 42, and 43 are formed in such a manner that these terminals do not protrude from any side faces of a resin mold 44 and are on the same surface with the side faces of the resin mold 40. These lead terminals are connected with a base, an emitter, and a collector electrode of a semiconductor device 40.

With such constitution, the mounting area can be reduced by a portion of the tips of the lead terminals 41, 42, and 43 which retract into the side faces of the resin mold 44, and the factor of effective area can be slightly improved. However, the resulting improvement to the size of the dead space is not great.

To improve the factor of effective area, the area of a semiconductor chip in a semiconductor device should be almost the same as the mounting area. In the resin mold type semiconductor device, even though the tips of lead terminals do not protrude from the side faces of the resin mold like the prior art, it is difficult to improve the factor of effective area due to the presence of the mold resin.

Further, in the semiconductor device described above, since lead terminals connected to the semiconductor chip and mold resin are both indispensable, processes of wire connection of the semiconductor chip and the lead terminals and of injection molding of resin can not be dispensed with, meaning that the manufacturing process can not be simplified and that manufacturing costs can not be reduced.

In order to maximize the factor of effective area, as described above, it must be possible to make the area of the semiconductor chip almost equal to the mounting area by mounting the semiconductor chip directly on the mounting substrate.

Known method of mounting a semiconductor chip on a substrate, such as a mounting substrate, is shown in FIG. 5, which illustrates a technology of face down bonding of a flip chip on which a plurality of bump electrodes 46 are formed on a semiconductor chip 45 as disclosed in Japanese Patent Laid-Open Publication No. Hei 6-338504. However, in a semiconductor device joined by such face down bonding, problems, such as the peeling of bump electrodes from the semiconductor device, often arise when stress, such as thermal stress, is applied to the bump electrodes.

Another known art for mounting a semiconductor chip on a substrate such as a mounting substrate is the technology of die bonding a semiconductor chip 53 on a conductive pattern 52, which is formed on a mounting substrate 51, and connecting an electrode of the conductive pattern 52 arranged around the semiconductor chip 53 and its electrode by means of a wire 54, as is disclosed in Japanese Patent Laid-Open Publication No. Hei 7-38334 (see FIG. 6).

A fine line of gold is normally used as a wire for connecting the semiconductor chip 53 and the conductive pattern 52 which is arranged around the semiconductor chip 53. It is preferable to carry out bonding in a heated atmosphere of approximately 200 degrees centigrade to 300 degrees centigrade in order to increase peel strength (pull strength) at a section of bonding junction which is connected with the fine gold line by bonding.

However, when die bonding of the semiconductor chip on the mounting substrate of insulating resin system is performed, if heating temperature is raised to a temperature as described above, the wiring substrate will be warped. In order to melt solder used for fixing other circuit elements, such as a chip condenser and chip resistor, which are mounted on the mounting substrate, wire bonding junction is attained by setting the heating temperature to approximately 100 degrees centigrade to 150 degrees centigrade. However, there is then a problem that peel strength at a section of bonding junction is lowered.

In this method, a semiconductor chip is coated by thermohardening resin, such as epoxy resin after undergoing die bonding. As described above, however, low temperature wire bonding leads to decreased bond strength, whereby the joint of a bonding section peels due to a shrinkage of the epoxy resin at the time of heat curing.

SUMMARY OF THE INVENTION

The present invention is made in consideration of the problems described above and is directed at providing a semiconductor device with advanced functions and high junction reliability, and to a method of manufacturing such devices. In this semiconductor device, metal lead terminals to be connected with a semiconductor device and sealing mold resin are not required, and a semiconductor wafer on which the semiconductor chip was manufactured is used as a visual package for the semiconductor device. Thus, the factor of effective area which is a ratio of an area of the semiconductor chip to a mounting area of a mounting substrate is maximized, while dead space is minimized.

In the present invention, the following constitution and manufacturing method are adopted so as to solve the aforementioned problems.

More specifically, the semiconductor device according to the present invention may comprise a semiconductor chip which is loaded with an IC or the like and with a plurality of electrodes provided on its principal plane; a plurality of external connector electrodes having a block form arranged around the semiconductor chip at predetermined intervals, and formed by a substrate other than the semiconductor chip; a wiring substrate arranged face to face with the semiconductor chip and the external connector electrodes and having on its surface a wiring pattern for electrically connecting the electrodes of the semiconductor chip with the external connector electrodes; and connectors which connect the wiring pattern with the electrodes of the semiconductor chip and the external connector electrodes, and arranged in such a manner that a space is formed between the semiconductor substrate and the semiconductor chip.

According to another aspect of the invention, thermohardening insulating resin may be filled into the space.

The connectors may also be composed of bump electrodes, and connection may be achieved by a plurality of junction layers formed on the surfaces of these bump electrodes.

Further, the external connector electrodes may be composed of copper plates.

A manufacturing method of the semiconductor device as described above could comprise steps of: forming an epitaxial layer on a first plane of a first substrate made of a semiconductor material on which a plurality of chip located regions correspond to semiconductor device size; forming first conductive connectors on the epitaxial layer in each of a plurality of first region on the peripheries of each chip region; forming a plurality of wiring patterns arranged within an area of the semiconductor device size on a second substrate, a first edge of the wiring patterns provided in an area corresponding to the plurality of the first region of the first substrate, and a second edge of the wiring patterns extended to an area corresponding to the plurality of a second region which is surrounded by the plurality of the first regions and within the chip located region of the first substrate; forming second conductive connectors on the first and second edge of the wiring patterns; arranging the first and second substrates such that a space is formed between them and such that the first and the second connectors on the second regions are electrically connected and fixed; filling insulating resin into the space; forming external connector electrodes composed of the first substrate in the first regions by forming slits at boundaries of the first regions from a surface of the first substrate and electrically separating the first substrate in the first regions; forming a storage space for storing a semiconductor chip in the chip located region by removing the first substrate from the chip located region; locating the semiconductor chip in the chip locating region, and electrically connecting and fixing electrodes formed in the semiconductor chip and the second connectors provided in the second region; and dicing the first and second substrate at the boundary of every the area corresponding to the semiconductor device size and separating the wafers after each semiconductor device.

PREFERRED EMBODIMENTS OF THE PRESENT INVENTION

First Embodiment

A semiconductor device and manufacturing method according to a first embodiment of the present invention will next be described with reference to FIGS. 7 to 30.

Figure 7:
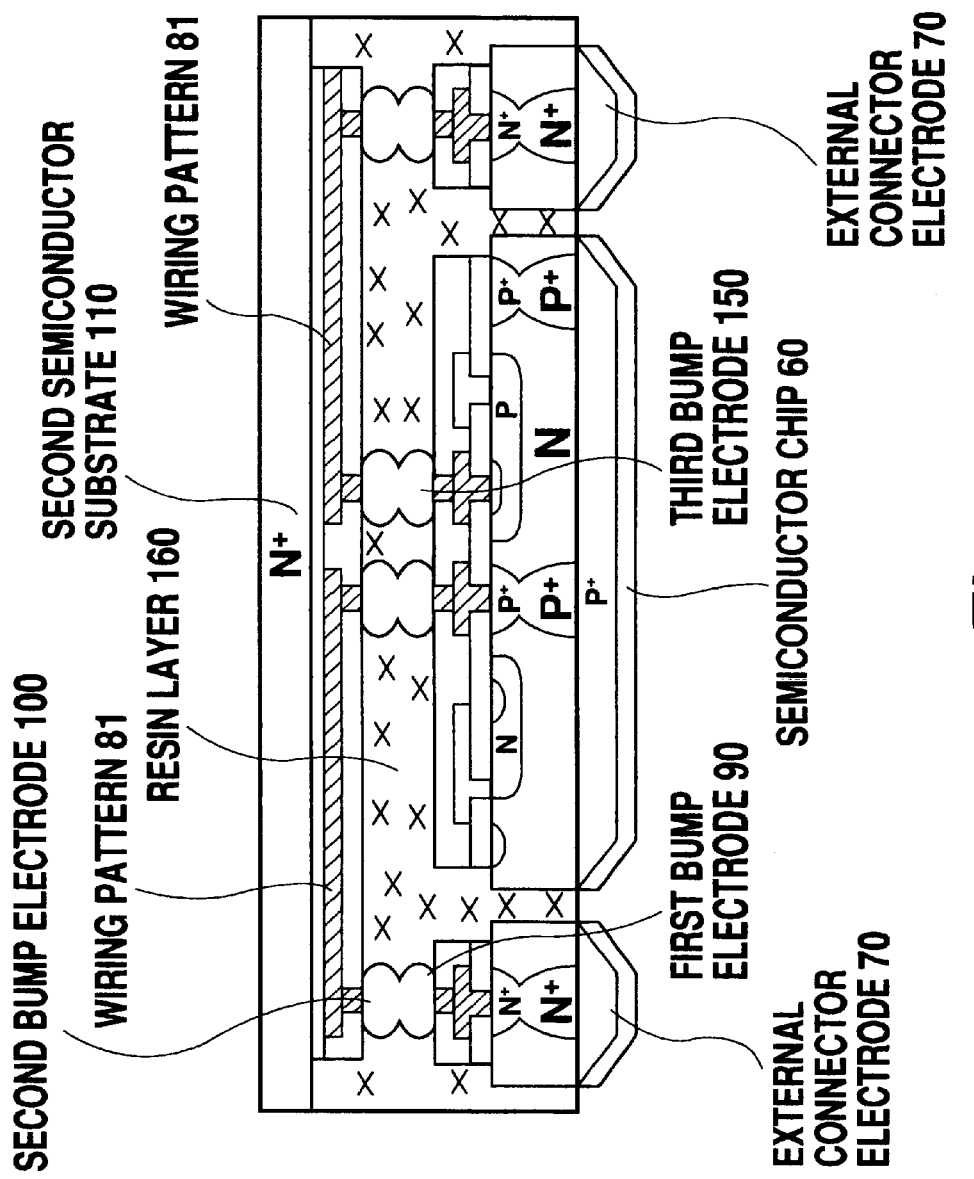
FIG. 7 is a section showing a semiconductor device according to a first embodiment of the present invention.

The semiconductor device comprises a semiconductor chip 60, a plurality of external connector electrodes having a block form 70, a second semiconductor substrate 110 to be used as a wiring substrate, and first and second bump electrodes 90 and 100, each of which is an example of connector, as shown in FIG. 7.

Also as shown in FIG. 7, the external connector electrodes 70 are connected with connecting electrodes of the semiconductor chip 60, arranged closely to at least a periphery of the semiconductor chip 60 and at a prescribed distance from the semiconductor chip 60, and formed by a semiconductor substrate other than the semiconductor chip 60.

Further, a wiring pattern 81 for electrically connecting each electrode of the semiconductor chip 60 with the external connector electrodes 70 is formed on the second semiconductor substrate 110 which is to be a wiring substrate, and arranged face to face with the aforementioned semiconductor chip 60 and the external connector electrodes 70.

Further, connector 90 and 100 connect electrodes of the semiconductor chip 60 and external connector electrodes 70 and form a prescribed space.

The semiconductor device according to this embodiment, as shown in FIG. 7, includes a second semiconductor substrate 110 to be used as a wiring substrate and the wiring pattern 81 provided on a top face of the second semiconductor substrate 110. Therefore, unlike conventional semiconductor devices, metal lead terminals to be connected with external electrodes and a sealing mold for protection are not required, thereby enabling remarkable miniaturization of the semiconductor device. A detailed explanation will be given in the following description of the manufacturing method.

Figure 8:
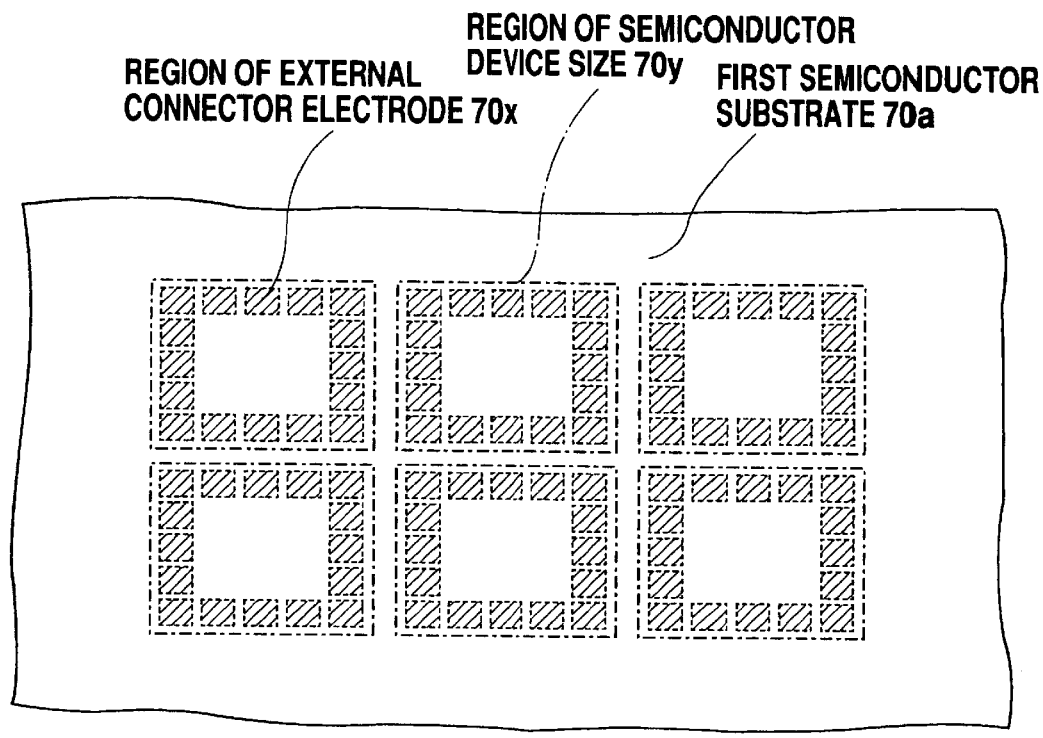
FIG. 8 is a top view illustrating a manufacturing method of the semiconductor device according to the first embodiment of the present invention.
Figure 9:
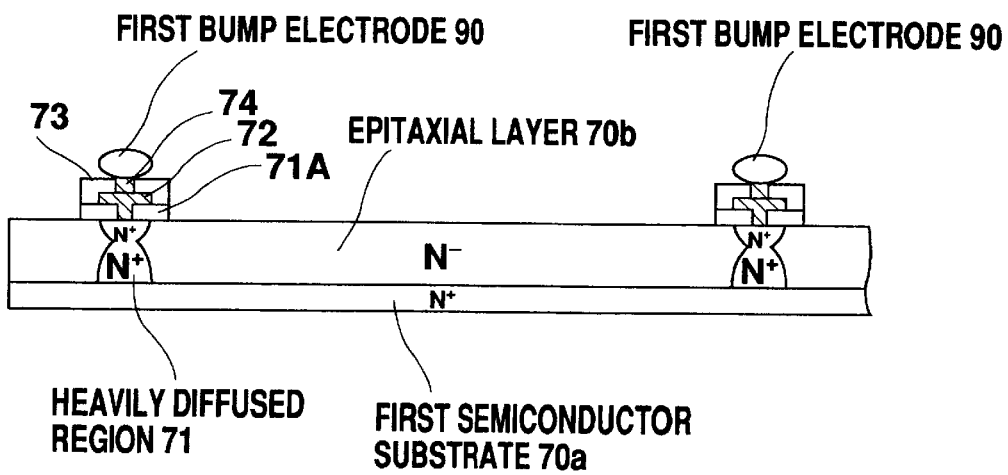
FIG. 9 is a section showing a manufacturing step of the semiconductor device according to the first embodiment of the present invention.

First, as shown in FIGS. 8 and 9, for example, an N– type epitaxial layer 70b is formed by an epitaxial growth technology on a first semiconductor substrate 70a having a wafer form which is composed of an N+ type single crystal silicon substrate. The first bump electrode 90 is formed in a region 70x (region drawn by oblique lines) to be used for external connector electrodes on the first semiconductor substrate 70a on which the epitaxial layer 70b is formed. Here, since the epitaxial layer is adopted as a wafer for the semiconductor chip 60 shown in FIG. 7 and a heavily diffused region 71 (usually used as a vertical separation region) is also adopted, an epitaxial layer is used as 70b. However, it is not limited to the epitaxial layer. It is also preferable to diffuse impurities on the first semiconductor substrate 78 by complete deposition, in other word, on all the surface including the back surface in high concentration.

Here, an N epitaxial layer is formed on the N substrate and the diffused region 71 like an N+ type vertical separation region is formed. However, also a reverse conduction type may be used. In other words, it is also preferable that a P type epitaxial layer is formed on a P+ type substrate to form a P+ type heavily diffused region.

The regions 70x to be used for external connector electrodes are regularly arranged on the first semiconductor substrate 70a in such a manner that a group of the regions 70x form a prescribed pattern, such as circular pattern or facing each other. Further, each group of external connector electrode regions 70x is arranged on the periphery of each of the regions of semiconductor device size 70y (dashed line regions) at a prescribed distance from the region of semiconductor device size 70y, and the first bump electrode 90 is formed above the group of external connector electrode regions 70x.

Figure 10:
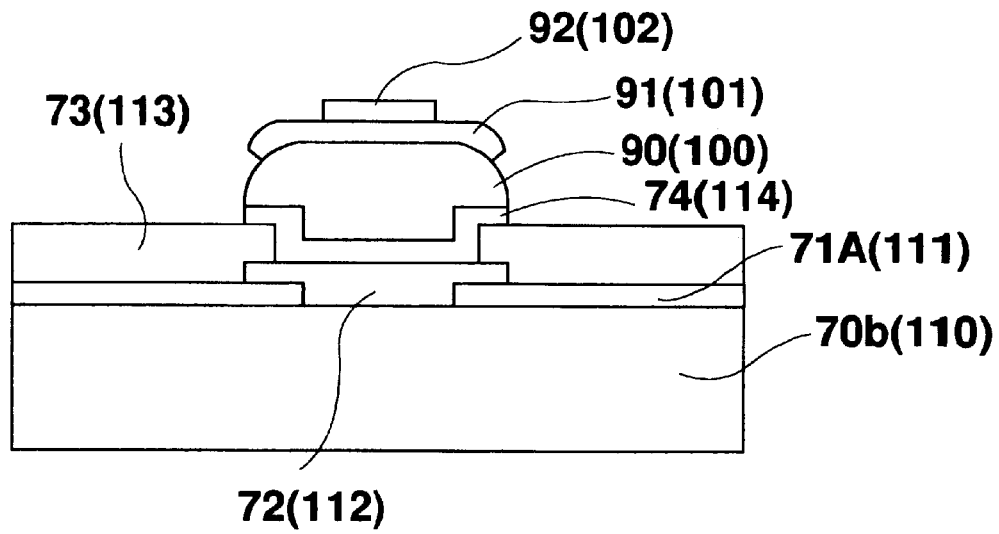
FIG. 10 is a section showing a bump electrode of the present invention.

A brief explanation of formation method of the first bump electrode will be given below with reference to FIGS. 9 and 10. FIG. 10 is a partial enlarged view of the first bump electrode 90 shown in FIG. 9.

By doping and diffusing N type heavily diffused impurities, such as phosphorus (P) and antimony (Sb) in the epitaxial layer 70b inside the regions of external connector electrodes 70x where the first bump electrode 90 is formed, a heavily diffused region 71 is formed. The heavily diffused region 71 is formed for the purpose of reducing internal resistance inside the region 71. After formation of the heavily diffused region 71, an insulating film, such as a silicon oxide film or a silicon nitriding film, is formed on the epitaxial layer 70b and an insulating film 71A having a contact hole is selectively formed on the regions of external connector electrode 70x.

By selectively evaporating metal material, such as aluminum, a connector electrode 72 is formed on the regions of external connector electrode 70x which is exposed by a contact hole. A passivation film 73 composed of insulating materials, such as PSG film, SiN, SiNx, or the like is formed on the connector electrode 72, and the connector electrode 72 is selectively exposed in the region of external connector electrodes 70x. Although partially formed insulating films 71A and 73 are shown in FIG. 9, these films may also be formed over the entire epitaxial layer. By selectively adhering chromium, copper, titanium, or the like by plating or evaporation on the exposed regions of external connector electrode 70x after forming the passivation film 73, a first barrier metal film 74 is formed in order to prevent nonconformity which may occur due to corrosion of the connector electrode 72. After forming the first barrier metal film 74, the first bump electrode 90, which will be the first connector, is formed.

The first bump electrode 90 approximately 30 μm to 50 μm thick is formed on the first barrier metal film 74 formed on each of the regions of external connector electrode 70x. The first bump electrode 90 is plated with gold. Chromium, copper, titanium, or the like is selectively adhered on the surface of the bump electrode by plating or evaporation to form a second barrier metal film 91 of several thousand angstrom.

Further, as shown in FIG. 10, junction layers 92 are formed on the second barrier metal 91 by evaporation of a metal for junction for the purpose of electrical junction with other substrates which will be described hereinafter. The junction layers 92 use a metallic material having a melting point lower than that of the bump electrode, which is composed of gold (Au), and higher than that of a solder material to be used at the time of mounting on a mounting substrate, which will be described below.

More specifically, if the melting point of gold (Au) is normally about 1064 degrees centigrade and the melting point of the solder material to be used at the time of mounting on a mounting substrate is about 170 degrees centigrade to 190 degrees centigrade, any material may be used for the junction layers 92 as long as it has a melting point within the both ranges. For example, a combination of gold and tin (AuSn) having a melting point of 230 degrees centigrade or 370 degrees centigrade which is formed by alternate plating lamination of gold (Au) and tin (Sn) may be used.

Figure 11:
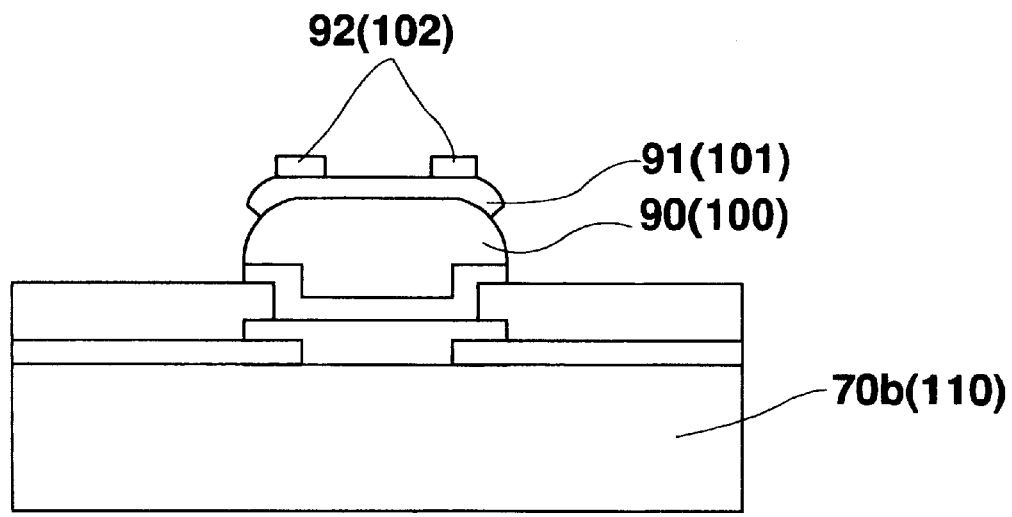
FIG. 11 is a section showing another bump electrode according to the present invention.
Figure 12:
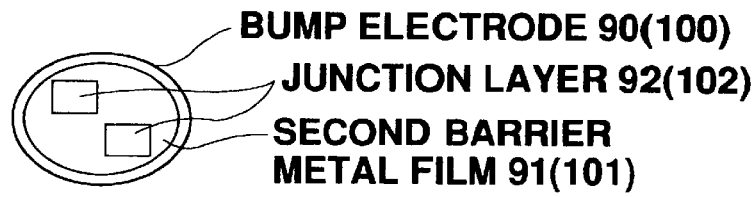
FIG. 12 is a top view showing another bump electrode according to the present invention.
Figure 13:
FIG. 13 is a top view showing another bump electrode according to the present invention.

The aforementioned junction layers are formed in such a manner that they spread to the outside from the center of the second barrier metal 91. However, it is also preferable to form the junction layers on the second barrier metal 91 separately from each other as shown in FIGS. 11, 12, and 13.

Figure 14:
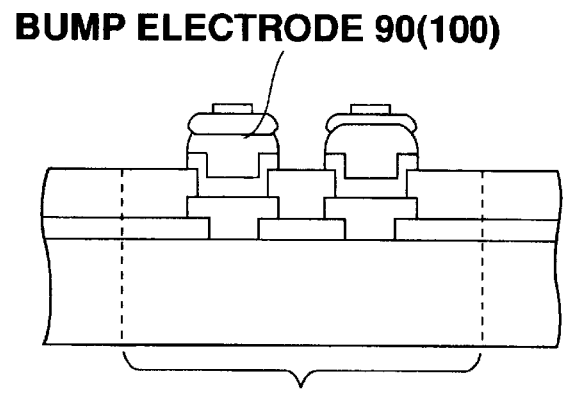
FIG. 14 is a section showing yet another bump electrode according to the present invention.
Figure 15:
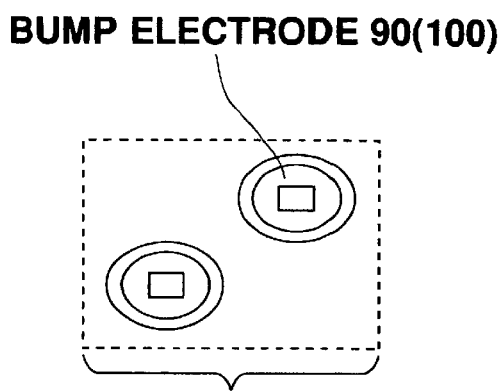
FIG. 15 is a top view of a further bump electrode according to the present invention.

Further, although only one bump electrode 90 was described for each of the regions of external connector electrode, no restriction is placed on their number for example, it is also preferable to form a plurality of bump electrodes on each of the regions of external connector electrode 70x as shown in FIGS. 14 and 15.

Figure 16:
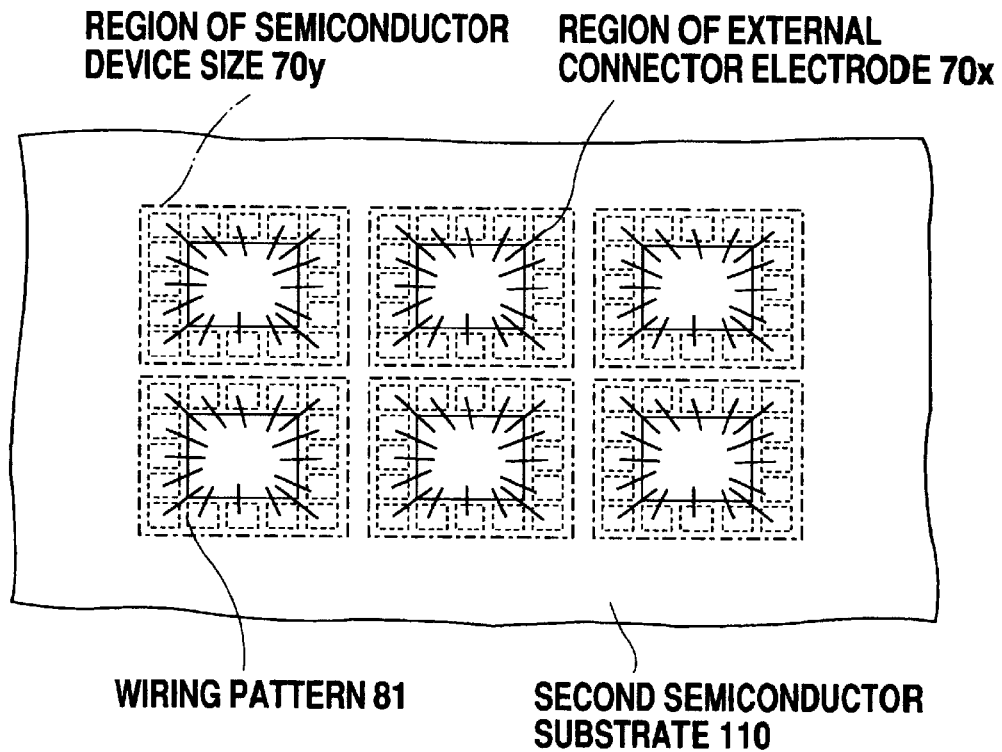
FIG. 16 is a top view illustrating a manufacturing step of a semiconductor device according to the first embodiment of the present invention.
Figure 17:
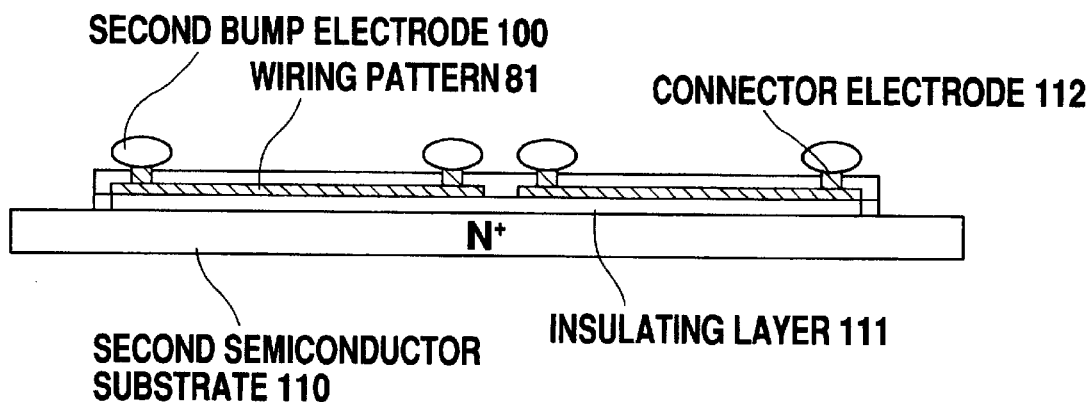
FIG. 17 is a sectional view showing a manufacturing method of the semiconductor device according to the first embodiment of the present invention.

Next, as shown FIGS. 16 and 17, for example, a second semiconductor substrate 110 having a wafer shape which is composed of a N+ type single crystal silicon substrate is prepared. Then, a plurality of wiring patterns 81 are formed within a region corresponding to the aforementioned region of semiconductor device size 70y on the second semiconductor substrate 110 in such a manner that one edge of the wiring pattern is formed in the regions of external connector electrode of the first semiconductor substrate 70a and the other edge is formed in the region of semiconductor device size 70y.

The wiring pattern 81 can be formed, for example, by forming an insulating layer 111, such as SiO2 or SiNX, on a surface of the second semiconductor substrate 110 and by selectively evaporating a metal, such as aluminum on the insulating layer 111 in a prescribed form. The wiring pattern 81, which will be described hereinafter, connects the regions of external connector electrode 70x and the semiconductor chip 60. Its pattern can be optionally formed, for example, by changing an arrangement of the external connector electrodes 70. In this embodiment, the wiring is formed in a star pattern as shown in FIG. 16.

After forming the wiring pattern 81 on the second semiconductor substrate 110, an insulating film, such as a silicon oxide film or a silicon nitriding film, is formed on the second semiconductor substrate 110. A contact hole is selectively formed in the insulating film at both edges, or at the center, of each wiring pattern 81 as occasion demands.

By selectively evaporating a metallic material, such as aluminum, the connector electrode 112 is formed on the wiring pattern 81 which is exposed by a contact hole. A passivation film 113 composed of an insulating material, such as a PSG film, SiN, or SiNx is formed on the connector electrode 112, and the connector electrode 112 is selectively exposed at both of the edges of the wiring pattern 81 as shown in FIG. 10. After forming the passivation film 113, chromium, copper, titan, or the like is selectively adhered on the exposed connector electrode 112 by plating or evaporating to form a first barrier metal film 114. In this way, occurrence of nonconformity which may occur due to corrosion of the connector electrode 112 is prevented. After forming the first barrier metal film 114, the second bump electrode 100 to be used as the second connector is formed. In FIG. 7, the insulating layer 111 and the passivation film 114 are partially formed, but it is also preferable to form them on the entire surface, including both edges.

The second bump electrode 100 is also formed similar to the first bump electrode 90. More specifically, the second bump electrode 100 approximately 30 μm to 50 μm thick is formed on the first barrier metal film 114 formed on the wiring pattern 81. This second bump electrode 100 is also treated with gold plating and the second barrier metal film 101 which carries several thousand angstrom is formed by selectively adhering chromium, copper, titanium, etc. to the surface of bump electrode by plating or evaporating.

Further, for the purpose of electrical junction with the bump electrode 90 which is formed on the aforementioned region of external connector electrodes 70x, a junction layer 102 is formed on the second barrier metal 101 by evaporation of metal used for junction using a metal material with a melting point lower than that of the second bump electrode 102 made of gold (Au), similar to the junction layer 92 formed on the first bump electrode 90. The metal material also has a melting point higher than that of solder materials to be used for mounting it on a mounting substrate, as will be described below. More specifically, supposing that the melting point of gold (Au) is normally about 1064 degrees centigrade and the melting point of the plating material to be used at the time of mounting on a mounting substrate is about 170 to 190 degrees centigrade, any material may be used for the junction layer 92 as long as it has a melting point within both ranges. For example, a combination of gold and tin (AuSn) having a melting point of 230 degrees centigrade or 370 degrees centigrade formed by alternate plating lamination of gold (Au) and tin (Sn) may be used.

While the aforementioned junction layer 102 is formed spreading outward from the center of the second barrier metal 101, it can be formed independently on the second barrier metal 101, as shown in FIGS. 11, 12, and 13. A cross shape can also be formed as shown in FIG. 13.

Figure 26:
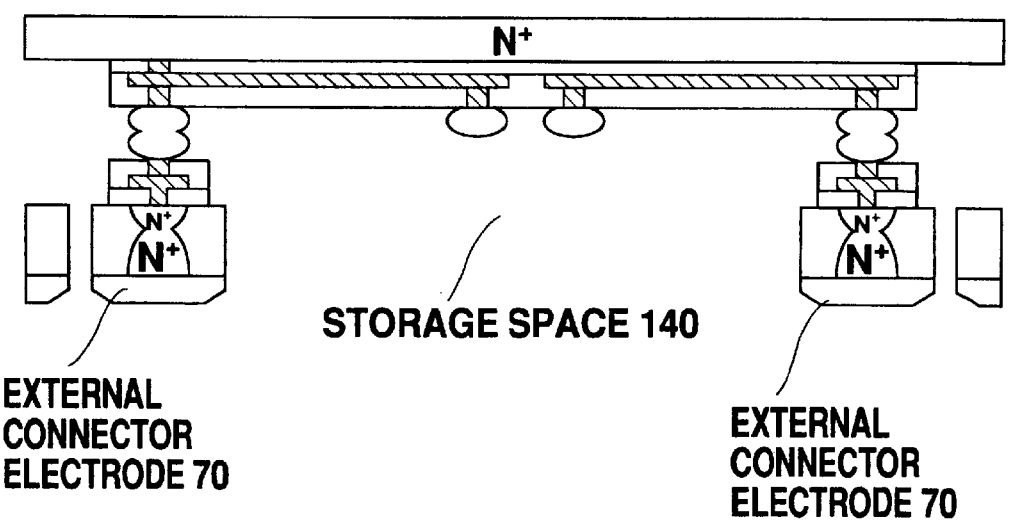
FIG. 26 is a section showing part of a manufacturing method of the semiconductor device according to the first embodiment of the present invention.

As will be described later, the bump supporting the external connector electrode is supported at several points, and therefore is strengthened as shown in FIG. 26. As a result, it has an additional advantage of preventing the junction layer 102 made of gold, tin, or the like from revolving when the solder melts.

Figure 18:
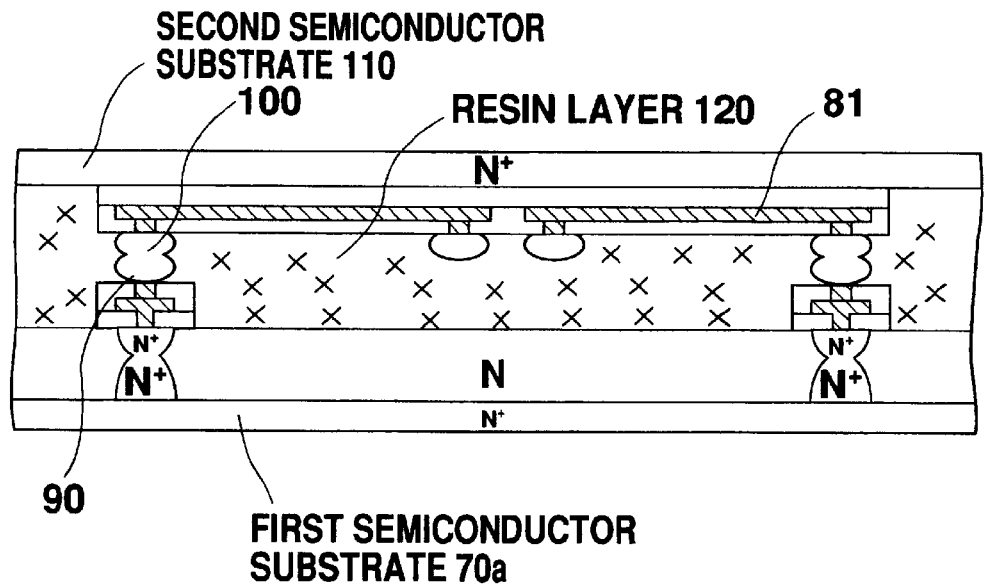
FIG. 18 is a sectional view showing a manufacturing method of the semiconductor device according to the first embodiment of the present invention.
Figure 19:
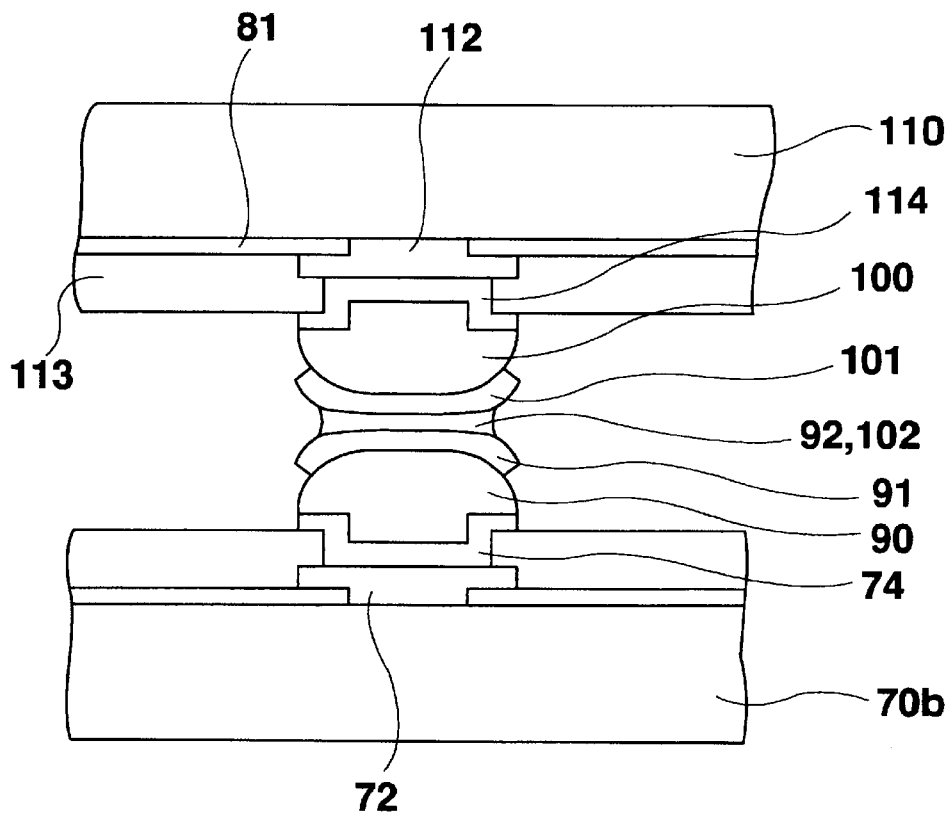
FIG. 19 is a section showing a junction part of a bump electrode.

Next, as shown in FIG. 18, a resin layer 120 is formed between the first substrate 70a and the second substrate 110 by connecting bump electrodes 90 and 100 which are formed on the first and second substrates 70a and 110. Connecting a plurality of bump electrodes 90 and 100 which are formed on the both mounting substrates 90 and 100, as shown in FIG. 19, junction is undertaken at both junction layers 92 and 102 by melting junction layers 92 and 102 formed on the bump electrodes 90 and 100 without using gold bump electrodes 90 and 100 as a junction material. More precisely, a resin layer 120 is formed by connecting the first bump electrode 90, which is placed in the regions of external connector electrode 70x on the first semiconductor substrate 70a, with the second bump electrode 100, which is placed at the outside edge of wiring pattern 81 formed in a shape of radiation on the second semiconductor substrate 110, and by filling resin between two substrates.

For example, electric junction takes place by melting only junction layers 92 and 102 formed on bump electrodes 90 and 100, and positioning bump electrodes 90 and 100 into the heated atmosphere created through connecting the bump electrode 90 with the bump electrode 100 placed above both substrates 70a and 100. Because there are second barrier metal films 91 and 101 between each of the junction layers 92 and 102 and each of the bump electrodes 90 and 100, as mentioned above, the melted metal material of junction layers 92 and 102 and the gold (Au) of bump electrodes 90 and 100 are not eutectic. It is important to note here that electric junction between the region of external connector electrode 70x of the first substrate 70a and the wiring pattern 81 on the second substrate 110 is accomplished through the junction layers 92 and 102 formed on the both barrier metals 91 and 101, while bump electrodes 90 and 100 remain under the condition just after plating.

Figure 20:
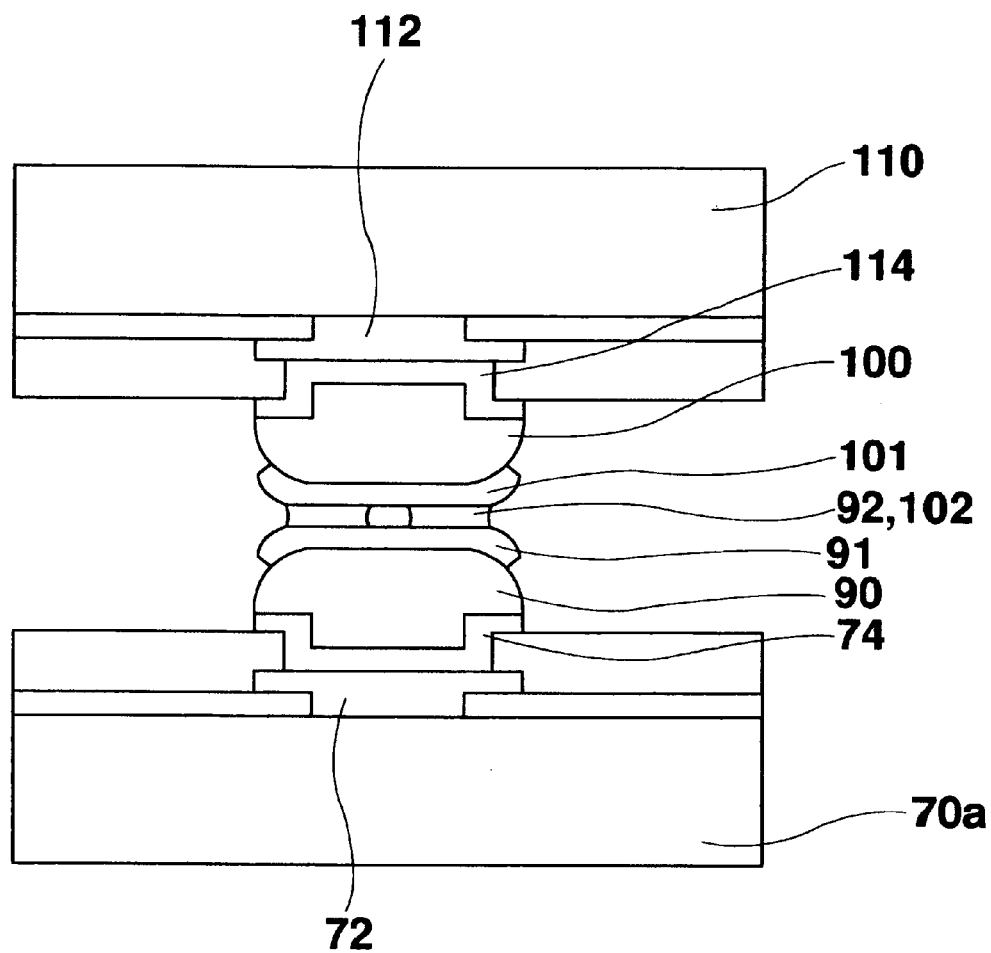
FIG. 20 is a section showing a junction part of a bump electrode.

Provided that the shape of junction layers 92 and 102 formed on each of the bump electrodes 90 and 100 as shown in FIG. 11, two or more pillars of junction layers 92 and 102 will be formed as shown in FIG. 20.

The first substrate 70a and the second substrate 110 are laminated with the junction layers 92 and 102 melted and electrically laminated on the bump electrodes 90 and 100. The aforementioned resin layer 120 is formed and both substrates 70 and 110 are temporarily fastened by having impregnated materials made of thermohardening resin in liquid epoxy system filled into the crevice between both substrates 70 and 110 and undergoing heat treatment while imposing a prescribed pressure on both substrates 70a and 110.

If the height of each bump electrode 90 and 100 placed on both substrates 70a and 110 is too low, the distance between substrates 70a and 110 becomes narrow. In other words, the film thickness of the resin layer 120 becomes thin. As a result, when a slit hole is formed as will be described later, a tip of the slit hole touches the surface of the second substrate 110 and may sever the wire pattern 81. Therefore, it is necessary to have sufficient distance between the substrates 70a and 110. The height of each of the bump electrodes 90 and 100 must be adjusted.

Figure 21:
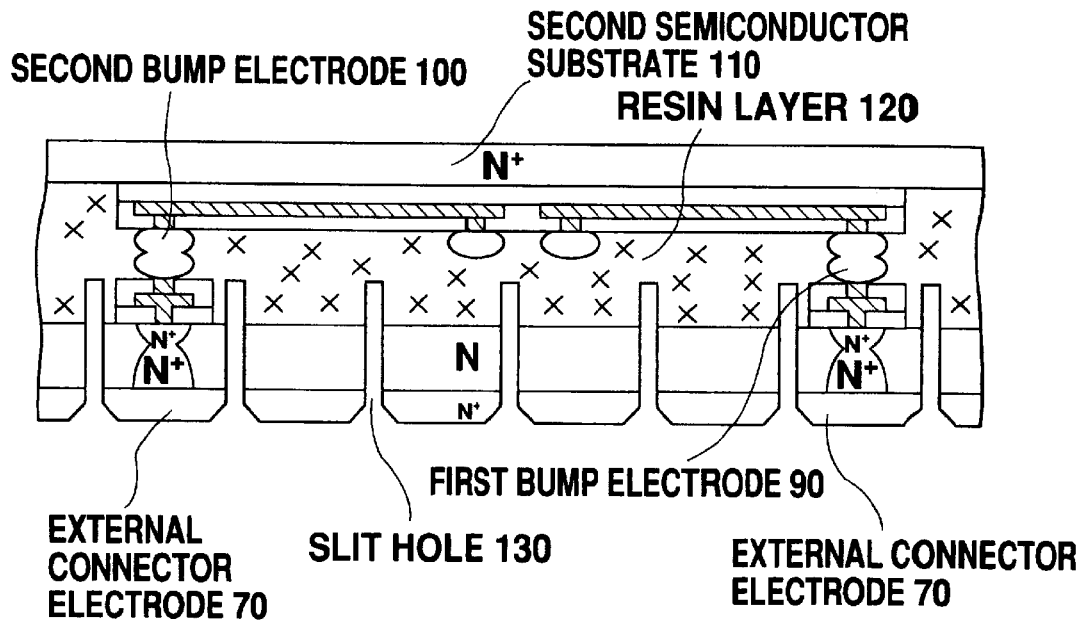
FIG. 21 is a section showing a manufacturing method of the semiconductor device according to the first embodiment of the present invention.
Figure 22:
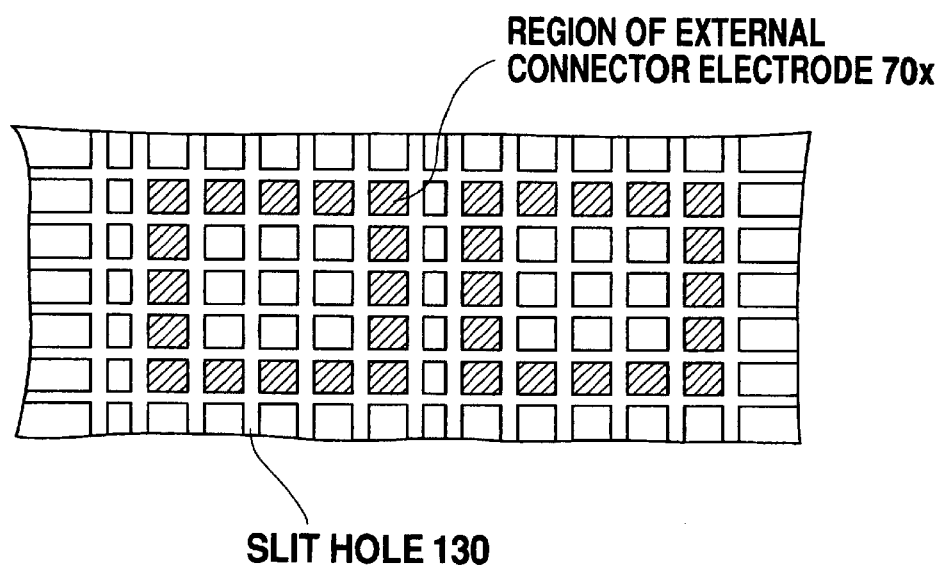
FIG. 22 is a top view showing part of a manufacturing method of the semiconductor device according to the first embodiment of the present invention.

Next, as shown in FIGS. 21 and 22, the first substrate 70a is severed so as to electrically separate each of the regions of external connector electrode 70x on the first substrate 70a from the reversal facet of the first substrate 70, and a plurality of slit holes 130 are formed just like a lattice. These slit holes 130 may be formed by using a dicing blade of a dicing device, which can precisely adjust width and depth of dicing without requiring the purchase of new devices. The width of dicing is determined by the width of the dicing blade. Although the depth of dicing varies depending on the manufacturer of a dicing device, the precision error is approximately between 2 μm and 5 μm with present technology. Therefore, without severing the wire pattern 81 on the second substrate 110, the dicing blade severs with certainty only the first substrate 70a and electrically and precisely separates the region of external connector electrode 70x.

Next, the process of formation of slit holes 130 will be explained.

Figure 23:
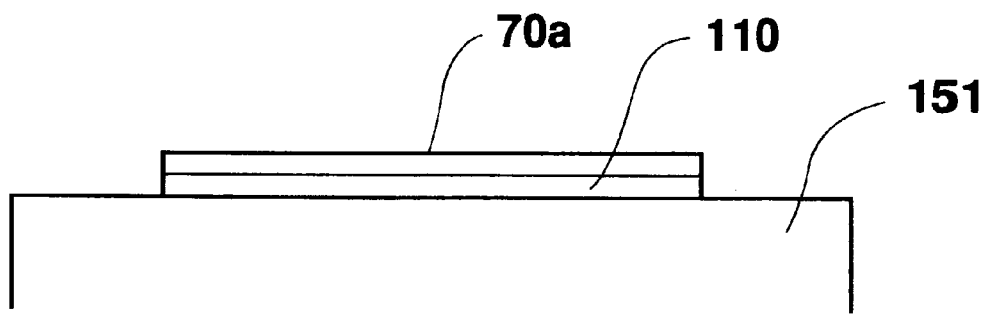
FIG. 23 is a section showing part of a manufacturing method of the semiconductor device according to the first embodiment of the present invention.
Figure 24:
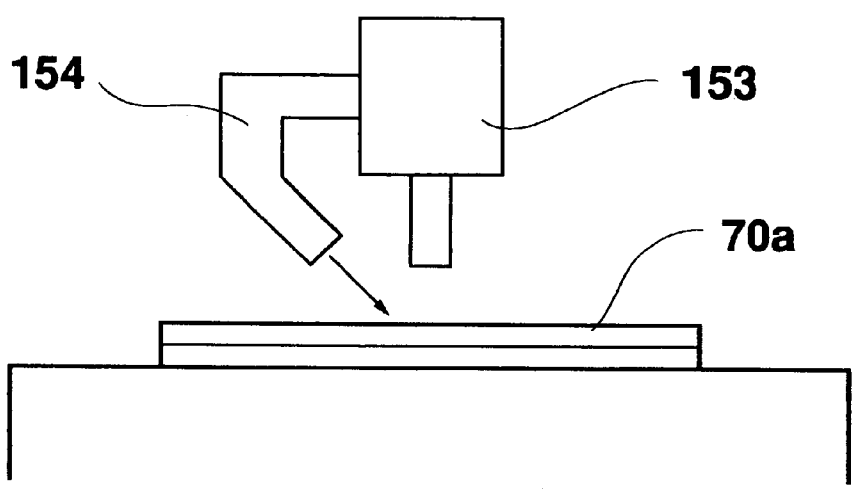
FIG. 24 is a section showing part of a manufacturing method of the semiconductor device according to the first embodiment of the present invention.
Figure 25:
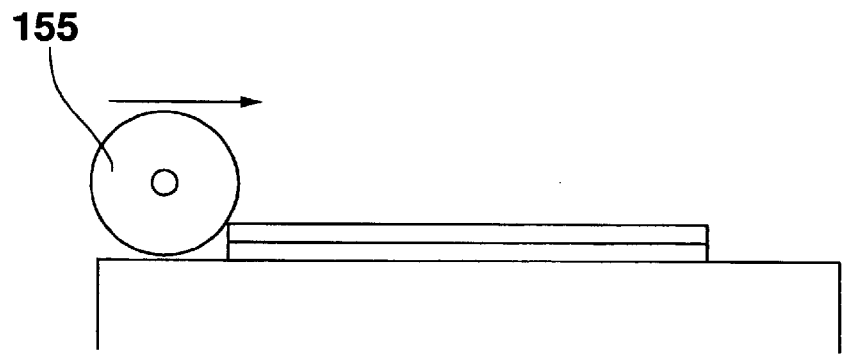
FIG. 25 is a section showing part of a manufacturing method of the semiconductor device according to the first embodiment of the present invention.

As shown in FIG. 23, the first substrate 70a is positioned upward and maintained on dicing device table 151. As shown in FIG. 24, infrared rays, which transmit into the inside of the first substrate 70a, are then irradiated on the surface of the first substrate 70a from the infrared ray lamp device 154. The reflecting light is detected by the infrared ray detector 153. The position of slit hole formation area is aligned and, as FIG. 25 shows, dicing blade 155 forms lattice-like slit holes 130 as shown in FIG. 22. By using a dicing device with an infrared ray detecting function, slit holes 130 which sever only the first substrate 70a can be formed even from the reverse side of the first substrate 70a. In dicing device without an infrared ray detecting function, it is difficult to precisely form slit holes 130 because the alignment can not be precisely made. The dicing width of slit holes 130 formed in this process is, for example, about 0.1 mm, in order to maintain the sufficient insulation of adjacent external connector electrodes 70 after severance.

The dicing (slit hole 130) depth is adjusted so as to enter the resin layer 120 by about 2 μm to 5 μm, because it is necessary to assure the severance of the first substrate 70a in order to electrically segregate each of the regions of external connector electrode 70x.

A plurality of regions of external connector electrode 70x formed on the first substrate 70a become individual external connector electrodes 70 of each semiconductor device, being electrically segregated by lattice-like slit holes 130 formed from the back side of the first substrate 70a.

In this embodiment, before a slit hole 130 is formed, dicing treatment on the first substrate 70a is made with a trapezoidal a dicing blade of the aforementioned dicing device at a prescribed depth in the area of slit holes 130 (plane the surface of the first substrate 70a). In the dicing treatment process, a taper part is formed at the edge of each external connector electrode 70. While the angle of taper part depends on a shape of dicing blade, it is flexibly determined by the size of soldering junction part and quantity of solder.

A metal plated layer is formed on the surface of the first substrate 70a after severing a part of the first substrate 70a and forming a taper part at the edge of each external connector electrode 70. For example, the plated layer covers the entire surface of the first substrate 70a with the treatment, such as electroplating or electroless plating. After forming the plated layer, as shown in FIG. 21, slit holes 130 are formed.

As explained above, a heavily diffused layer is placed on the region of external connector electrode 70x on the first semiconductor layer 70a, and, as a result, electric loss caused by wiring resistance is reduced.

Figure 27:
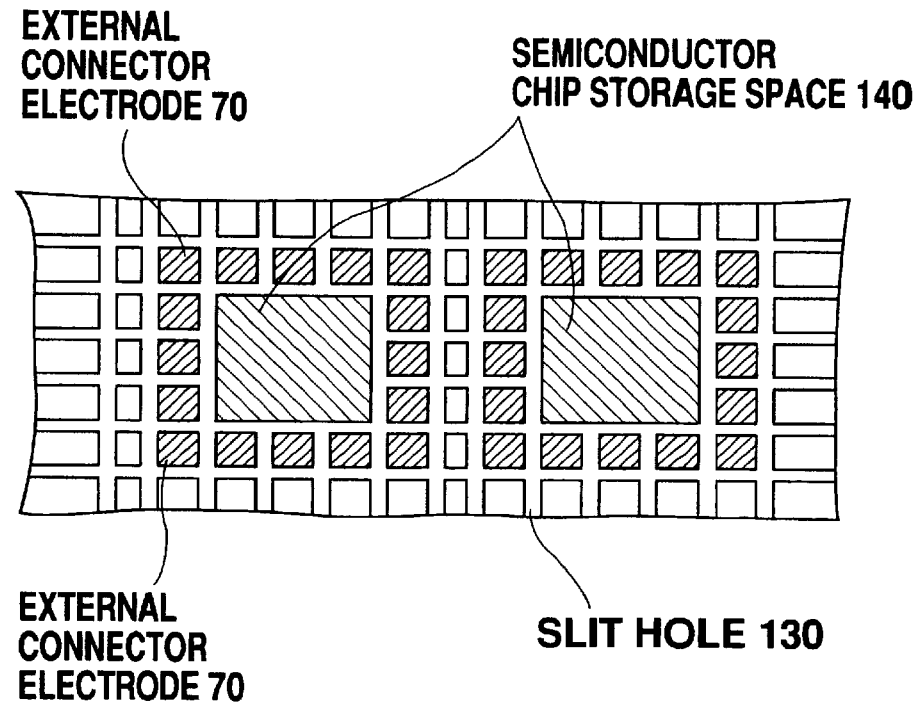
FIG. 27 is a top view illustrating a manufacturing method of the semiconductor device according to the first embodiment of the present invention.

Next, as shown in FIGS. 26 and 27, a storage space 140 for storing a semiconductor chip 60 is formed by taking off the first semiconductor substrate 70a in the region surrounded by at least external connector electrodes 70. As mentioned above, the external connector electrodes 70 on the first semiconductor substrate 70a are electrically connected with the wiring pattern 81 on the second semiconductor substrate 110 through the first and second bump electrodes 90 and 100. On the other hand, as the first semiconductor substrate 70a other than the external connector electrode 70 is temporarily fixed to the second semiconductor substrate 110 by the resin layer 120, only external connector electrode 70 fixed by the junction layers 92 and 102 on each of the bump electrodes 90 and 100 remains, other part of the first substrate 70a being taken off. As a result, a storage space 140 to store a predetermined size of semiconductor chip 60 is formed in a region surrounded by the external connector electrode 70, as shown in FIGS. 26 and 27.

Figure 28:
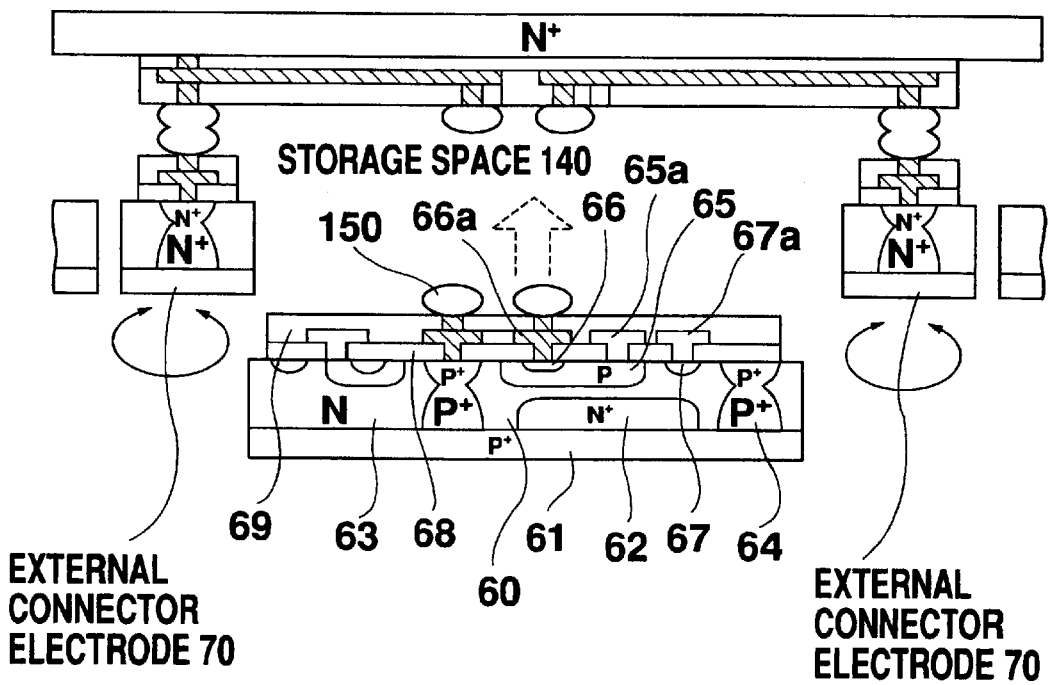
FIG. 28 is a section showing a manufacturing method of the semiconductor device according to the first embodiment of the present invention.

Next, as shown in FIG. 28, after placing semiconductor chip 60 in the storage space 140, semiconductor chip 60 and other second bump electrodes 100 formed on the wiring pattern 81 of the second semiconductor substrate 110 are electrically connected.

The semiconductor chip 60, for example, as shown in FIG. 28, forms a predetermined shaped photomask on P type semiconductor substrate 61. It diffuses N type heavily diffused impurities, such as antimony, and an island-like N+ type embedded collector region is formed. The N– type epitaxial layer 63 is formed on the substrate 61 using the epitaxial growth technology.

While herein an epitaxial layer adopted as a bipolar element used in a semiconductor chip, MOS technology does not always use an epitaxial layer, and the adoption of an epitaxial layer is therefore not required in the present invention.

An isolation diffusion region 64 is formed by diffusing P+ impurities, such as boron, to the isolation diffusion region of epitaxial layer 63. The N region, defined as the transistor active region through the isolation diffusion region 64, is enclosed by the P isolation diffusion region. An island-shaped base region 65 with a predetermined depth is formed by selectively diffusing P type impurities, such as boron (B) to a predetermined region of epitaxial layer 63.

The transistor emitter region 66 and the collector contact diffused region 67 are formed through selective heat diffusion of an N type of impurity, such as phosphorus (P) and antimony (Sb) in the concerned base region 65 and a collector region.

An insulating layer 68, such as silicon oxide film or silicon nitriding film with emitter contact holes and collector contact holes is formed on the surface of semiconductor chip 60.

In the region exposed by base contact holes, emitter contact holes, and collector contact holes, a base electrode 65a, an emitter electrode 66a, and a collector electrode 67a selectively vaporized by metal materials such as aluminum are formed.

When aluminum is used for the base electrode 65a, the emitter electrode 66a, and the collector electrode 67a, a passivation film 69 composed of the insulation material, such as a PSG film, SiN, and SiNx is formed on the substrate 61, and the surface of each of the electrodes 65a, 66a, and 67a is exposed, selectively removing the passivation film 69 on the base electrode 65a, emitter electrode 66a, and collector electrode 67a, and/or, if necessary, the predetermined position of each of other electrodes. Furthermore, the first barrier metal film is formed in the exposed region, being selectively plated or vaporized with chromium, copper, or titanium, in order to avoid nonconformity which may be caused by corrosion of each electrode.

A bump electrode 150 is formed on each electrode of the semiconductor chip 60, as shown in FIGS. 10 and 11 above. When the back face of semiconductor chip 60 is used as electrode, four sides of the back face of semiconductor chip 60 are made to taper in order to form a soldering fillet.

After placing the semiconductor chip 60 in the each placing space 140 surrounded by the external connector electrode 70, and disposing it into the heated atmosphere at about 230 or 370 degrees centigrade, the junction layer 102 of the second bump electrode 100 formed on the second semiconductor chip 60 and the junction layer (not shown in the drawings) of the bump electrode 150 formed on the semiconductor chip 60 are electrically connected. Here, it is, of course, designed so that the installed back face of semiconductor chip 60 will be leveled at the same height or at a slightly lower height than the surface of external connector electrode 70.

Since each external connector electrode 70 is independently formed as described above, junction layers 92 and 102, which connect the first bump electrode 90 of each external connector electrode 70 with the second bump electrode 100 of the second semiconductor substrate, will be melted again during this heat treatment process. Therefore, there is possibility of nonconformity in the position of external connector electrode 70 due to revolving as indicated with an arrow in FIG. 28. However, this nonconformity, which causes malpositioning, can be prevented by featuring the junction layers 92 and 102 formed on each of the bump electrodes 90 and 100 as described in FIGS. 11 and 12, in which the malpositioning of external connector electrode 70 is prevented when semiconductor chip 60 is fixed.

In addition, because the structure having round-shape bump electrode shown in FIG. 10 is unstable, a crack in the neck of the structure shown in FIG. 26 can easily be formed. However, the stability is strengthened using the structure showing FIGS. 12, 13, and 14.

Figure 29:
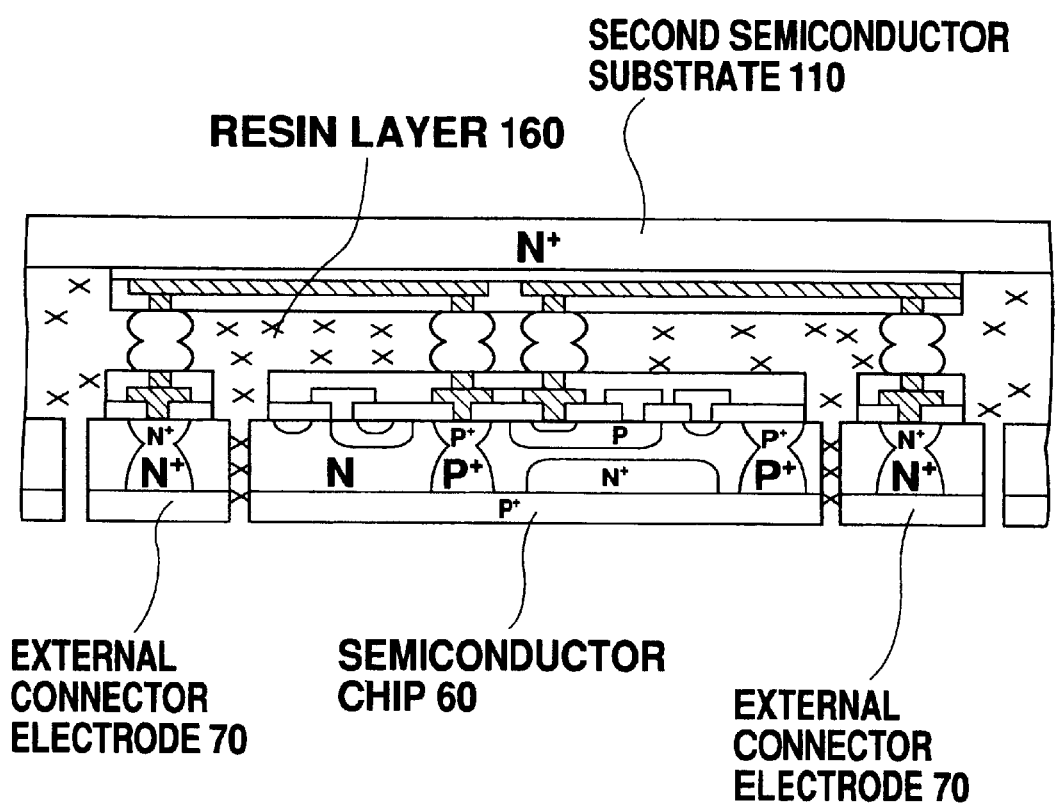
FIG. 29 is a section showing a manufacturing method of the semiconductor device according to the first embodiment of the present invention.

Next, as shown in FIG. 29, for the purpose of fastening each external connector electrode 70 and the semiconductor chip 60, a resin layer 160 is formed by once again filling impregnated resin composed of epoxy system resin into slit holes 130 and the space which has been created between each external electrode 70 formed by the first semiconductor substrate 70a and semiconductor chip 60, and the second semiconductor substrate 110. Dicing is performed at near the center of respective slit holes 130 surrounding the aforementioned region of semiconductor device size, i.e., the external connector electrode 70 placed in a circle, and as shown in FIG. 7, individual semiconductor devices are formed. This individual division is accomplished by dicing slit holes 130 in alignment which surround the region of semiconductor device size 70y, made by arranging the first semiconductor substrate 70a on the table of a dicing device in such a manner that the second substrate is on the lower side.

Part of resin layer 160 may remain on the side of a divided semiconductor device, allowing leakage of electric current from the external connector electrode 70 to be controlled. Separately divided semiconductor devices are individually taped and wrapped in reel form after measurement and labeling.

The semiconductor device manufactured in the manner mentioned above is stuck and mounted on the pad of conductive pattern formed on the wiring substrate, such as a ceramic substrate, a glass epoxy substrate, a phenol substrate and a metal substrate with insulation treatment. As a soldering layer with soldering cream printed is formed on this pad, firm packaging of a semiconductor device can be achieved if the semiconductor device according to the present invention is loaded after melting the soldering layer.

In this process, as explained above, the formation of tapering portions at the edges of each external connector electrode 70 optimizes soldering filet for the part of soldering junction with the conductive pad of mounting substrate, and enhances reliance on the junction intensity at soldering junction. This firm mounting process, although it is not shown in drawings, is same as the mounting process for other circuit elements, such as a chip condenser and a chip resistor, which are soldered and mounted on the mounting substrate.

Furthermore, when the semiconductor device is mounted on the mounting substrate, the solder used for fastening to the mounting substrate will not be short-circuited with nearby external connector electrode 70 due to the distance between each of the external connector electrodes, which is equivalent to the width of each slit hole 130.

Figure 30:
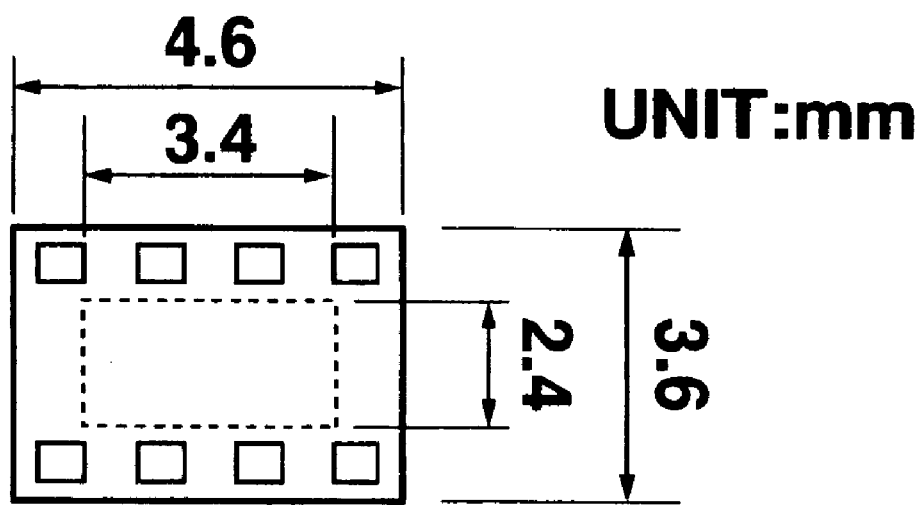
FIG. 30 shows the back face of a semiconductor device of the present invention.

The semiconductor device manufactured according to the manufacturing method of the present invention can be formed in the size shown in FIG. 30, for example. In a semiconductor device of this embodiment which has functions similar to those of the prior art described above, when the size of a semiconductor chip 60 is 3.4 mm×2.4 mm, the size of an external connector electrode 70 is 0.3 mm×0.3 mm, and both the width of slit hole 130 and the clearance between the semiconductor chip 60 and each external connector electrode 70 is 0.3 mm, a factor of effective area of the semiconductor device will be as follows. That is, since the element area will be 8.16 square mm and the semiconductor device area as a mounting area will be 16.56 square mm, the factor of effective area will be about 49.3 percent.

Because the factor of effective area of semiconductor device with chip size of 3.4 mm×2.4 mm is 27.2%, as explained above, the semiconductor device in the present invention makes the factor of effective area 1.81 times larger, reduces the dead space in the mounting area on the mounting substrate, and contributes to miniaturization of the mounting substrate.

While the semiconductor chip 60 of bipolar IC is installed into the storage space 140 in this embodiment, the present invention is not limited to such an embodiment. The present invention can, of course, be applied to a single semiconductor device such as a MOSLSI, a Vertical Power MOSFET, an IGBT and an HBT, and/or a combined semiconductor device of those.

Second Embodiment

A second embodiment of the present invention will next be explained with reference to the accompanying drawings. Explanation of common items which have already been explained for the first embodiment will not be repeated.

Figure 31:
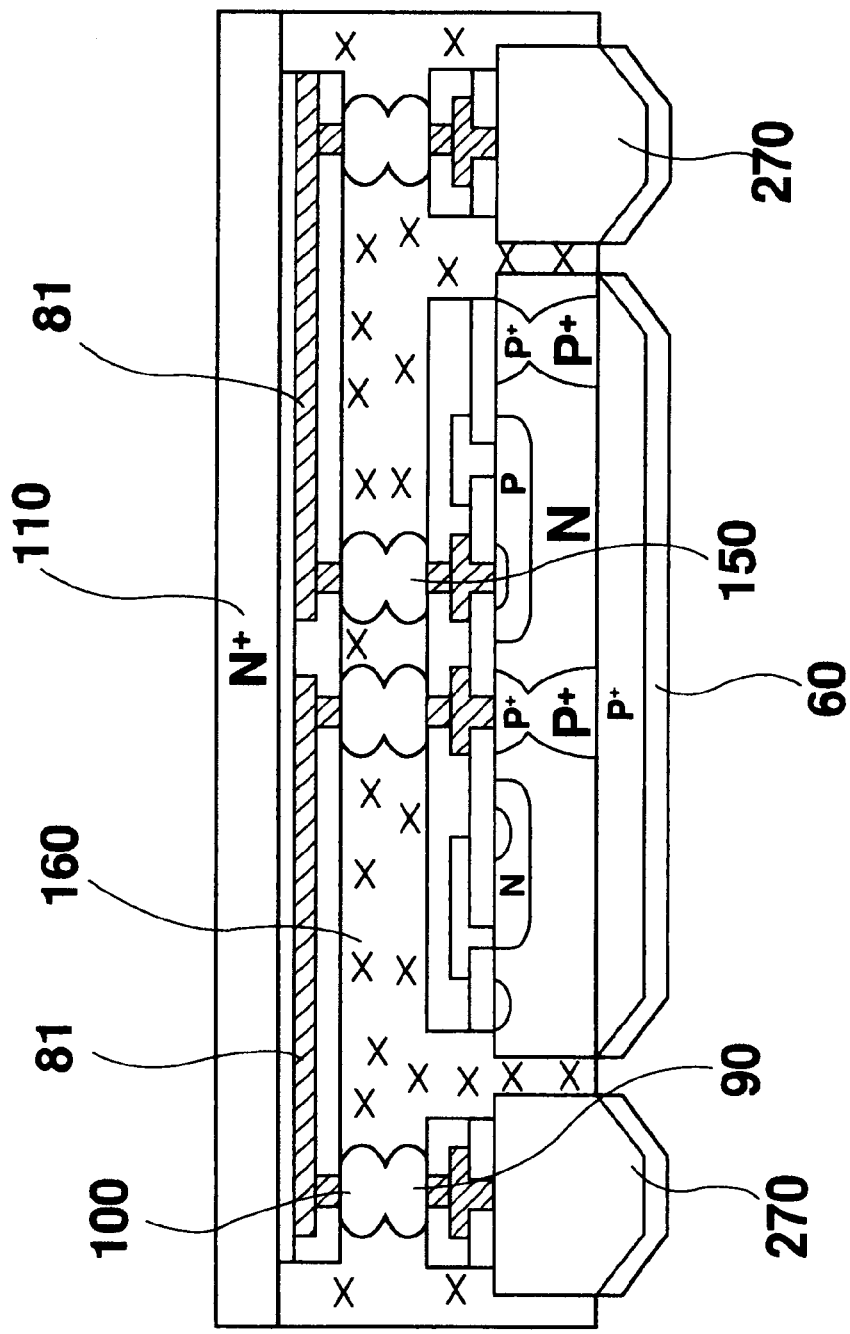
FIG. 31 is a section showing constitution of a semiconductor device according to a second embodiment of the present invention.

Explanation is provided at first on the semiconductor device in this embodiment with reference to FIG. 31.

While the semiconductor device according to the first embodiment as shown in FIG. 7 uses a low resisting semiconductor substrate through diffusion of high density impurity as external connector electrode 70, the only difference in the second embodiment is to use a metal plate, such as a copper plate, for the external connector electrode 270. As all other structure and functions are almost same as those of the first embodiment, detailed explanation will be omitted.

In the semiconductor device according to this embodiment, the use of copper for the external connector electrode provides far lower resistance than the semiconductor substrate with low resistance through diffusion of impurity.

The manufacturing method of a semiconductor device of this embodiment will be explained with reference to FIGS. 32 to 36.

Figure 32:
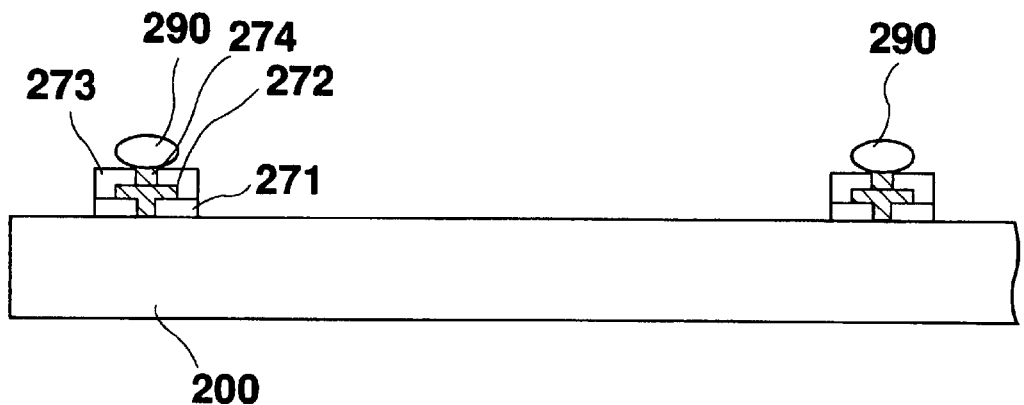
FIG. 32 is a section showing a manufacturing method of the semiconductor device according to the second embodiment of the present invention.

At first, as shown in FIG. 32, a first bump electrode 290 is formed on a copper plate 200 in the same process as that of the first embodiment.

More specifically, an insulation film is formed on the copper plate 200, such as a silicon oxide film, a silicon nitriding film or insulation resin. Next a contact hole is formed in the region of external connector electrode, and metal materials and/or metal alloy such as aluminum on a region of thus exposed external connector electrode in the contact hole, is selectively formed by evaporating or by other methods and then a connector electrode 272 is formed on the copper plate 200. After forming a passivation film over the connector electrode 272, a contact hole is made, whereby the connector electrode 272 is exposed.

Next, corrosion of the connector electrode 272 is prevented by forming a first barrier metal film 274 over the connector electrode 272 through selective adhesion of chromium, copper and titanium by plating or evaporation. A first bump electrode 290 is then formed as the first connector over the first barrier metal film 274.

Then, a barrier metal film (not shown) is formed over the first bump electrode 290, and a junction layer (not shown) is formed over this barrier metal film. As material, film thickness, and film forming condition are the same as those already described for the first embodiment, their explanation will not be repeated.

Figure 33:
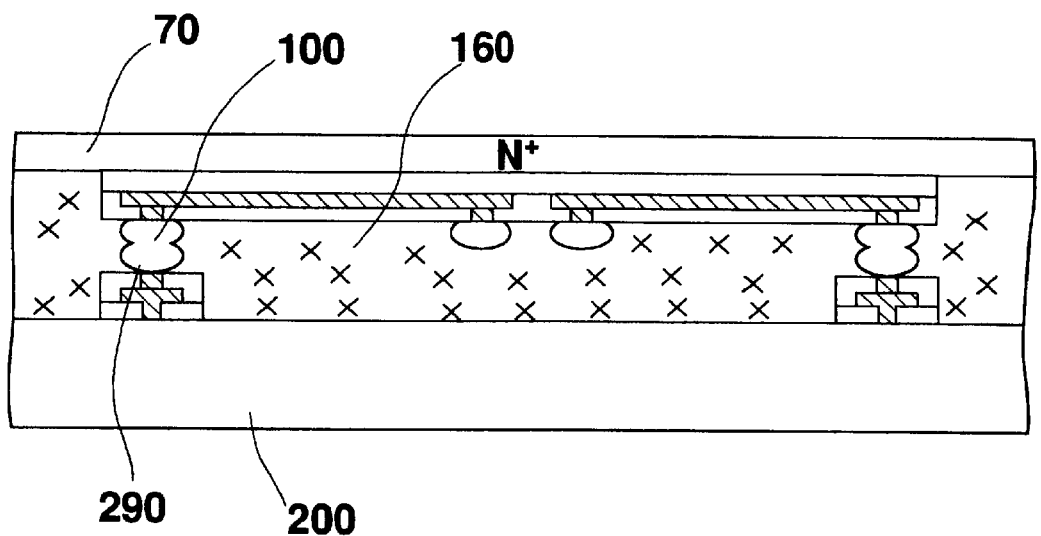
FIG. 33 is a section showing a manufacturing method of the semiconductor device according to the second embodiment of the present invention.

Next, a second semiconductor substrate 110 to be prepared as a wiring substrate shown in FIG. 17, as formed in the process explained in the first embodiment, is aligned to connect a first bump electrode 290 and a second bump electrode 100. After this connection is established, as shown in FIG. 33, resin 160 is injected into a space formed between the second semiconductor substrate 110 and the copper plate 200. The detailed explanation is omitted as the process is same as that of the first embodiment. Here the second semiconductor substrate can also be applied to copper, print, or ceramic substrates, and is not limited to the semiconductor substrate.

Figure 34:
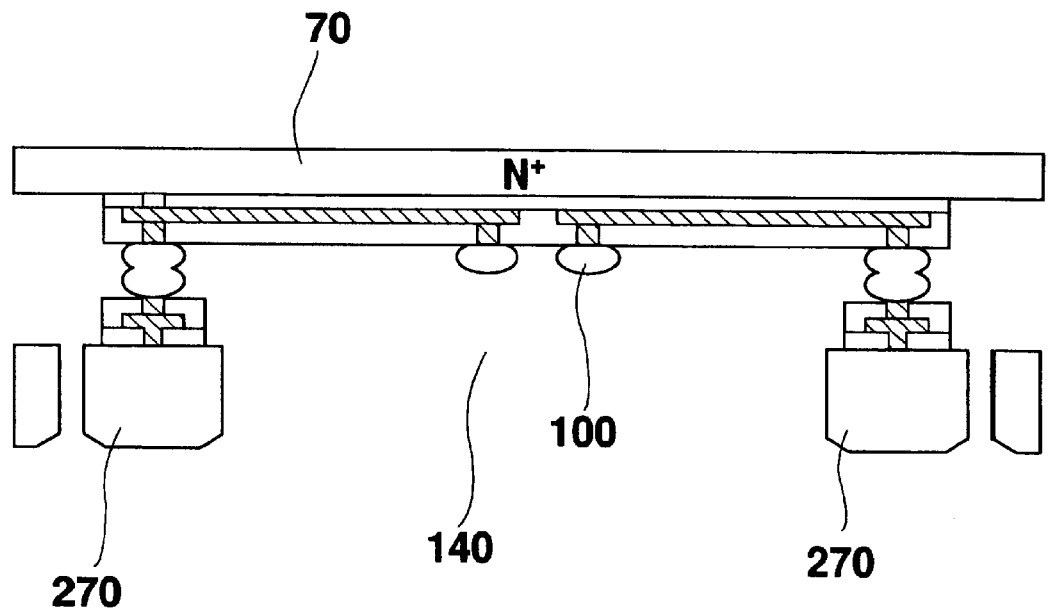
FIG. 34 is a section showing a manufacturing method of the semiconductor device according to the second embodiment of the present invention.

Next, as shown in FIG. 34, storage space 140 is formed for storing a semiconductor chip by severing copper plate 200 outside of a region forming the external connector electrode through dicing. The external connector electrode 270 is formed by the copper plate.

Figure 35:
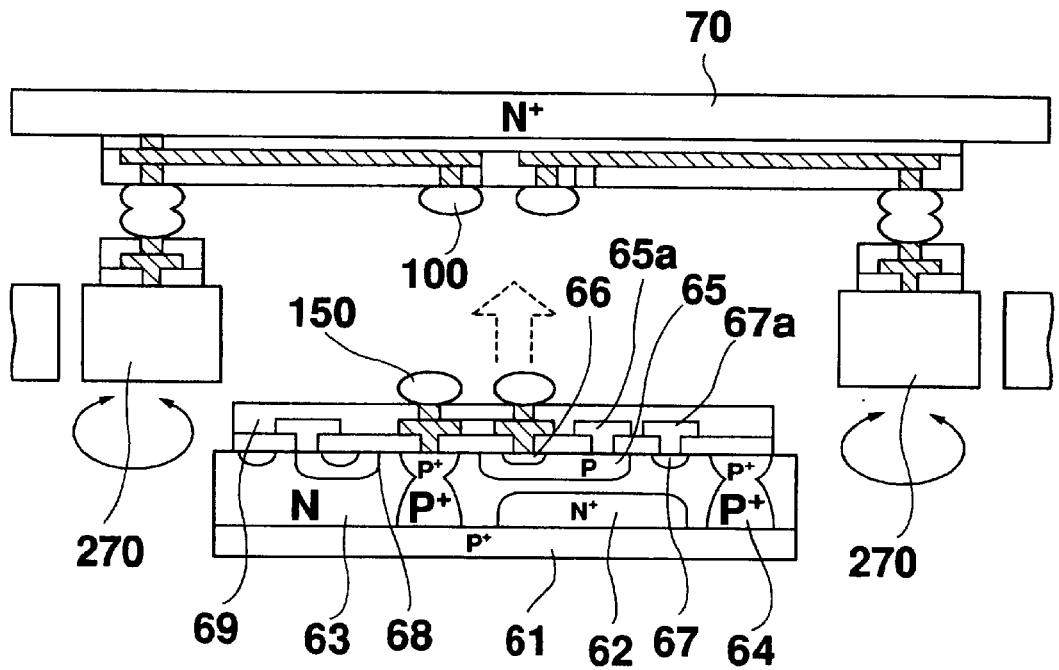
FIG. 35 is a section showing a manufacturing method of the semiconductor device according to the second embodiment of the present invention.

Next, the semiconductor chip 60, is, as in the first embodiment, installed into the storage space 140 after alignment, as shown in FIG. 35. Details of this process, as well, are the same as those of the first embodiment.

Figure 36:
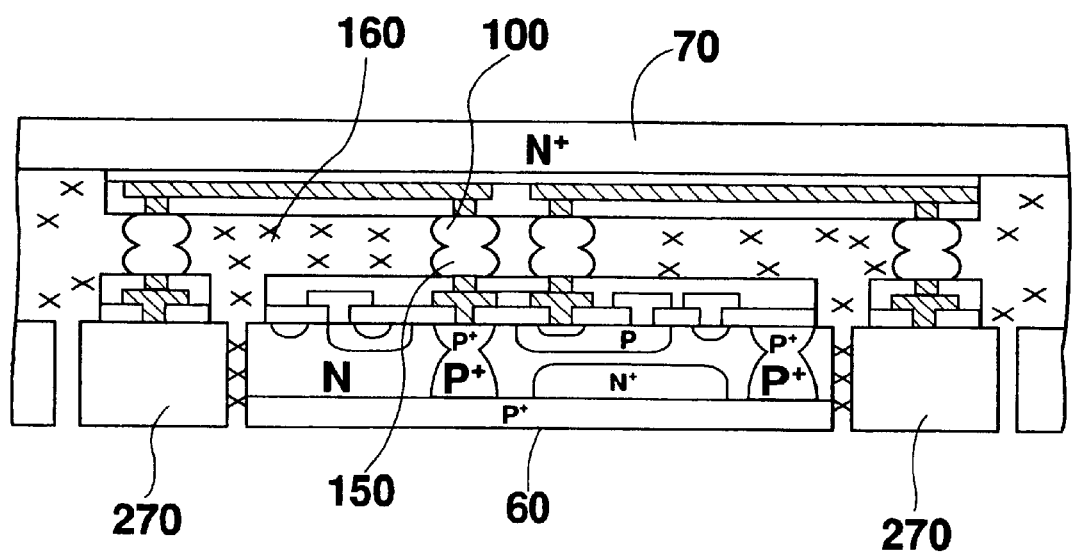
FIG. 36 is a section showing a manufacturing method of the semiconductor device according to the second embodiment of the present invention.

Next, as shown in FIG. 36, a bump electrode 150 being a connector electrode for semiconductor chip 60 and the second bump electrode 100 installed on the second semiconductor substrate 110 are electrically connected and attached, and resin 160 is then injected into the space formed between the semiconductor chip 60 and the second semiconductor substrate 110.

Next, the semiconductor device according to this embodiment is completed as shown in FIG. 31, by severing regions of semiconductor device size through dicing.

Another manufacturing method may be used with metal materials such as copper plate for reducing resistance of the external connector electrode. In this method, fine copper plate is severed, first adjusting to the size of external connector electrode, and such copper plate is then connected to each semiconductor device. In this method, the fine copper plate must be aligned and connected to the concerned semiconductor substrate regions.

For example, if ten external connector electrodes are required in one semiconductor device, the fine copper plate must be aligned and connected ten times. This alignment and connection requires a large amount of labor, resulting in lower work efficiency and lower yield.

However, in the manufacturing method of this embodiment, only one electrode alignment process suffices for a semiconductor device, even though there are a plurality of external connector electrodes because, after connecting and attaching the first bump electrode 290 to the second bump electrode 100 and aligning the copper plate 200 which will become a material for external connector electrode afterward with the second semiconductor substrate 110, unnecessary portions of copper plate 200 are severed for removal, and the severed space is used as a storage space 140 for semiconductor chip.

Therefore, as alignment and adhesion for each copper plate is not required, the labor needed for alignment is substantially reduced, and higher yield is achieved.

When copper plate 200 is used, the following method may also be applied.

Figure 1:
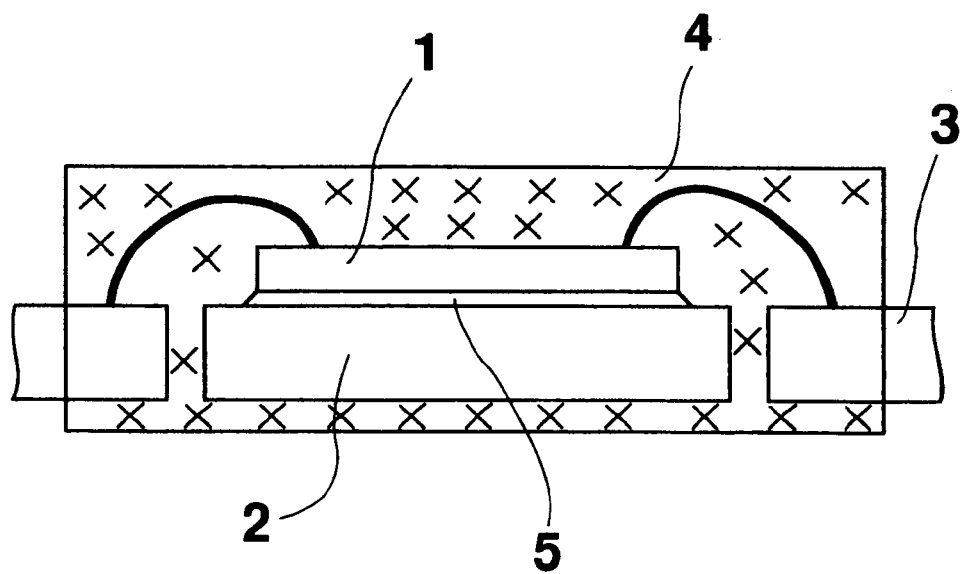
FIG. 1 is a section showing a conventional semiconductor device.
Figure 2:
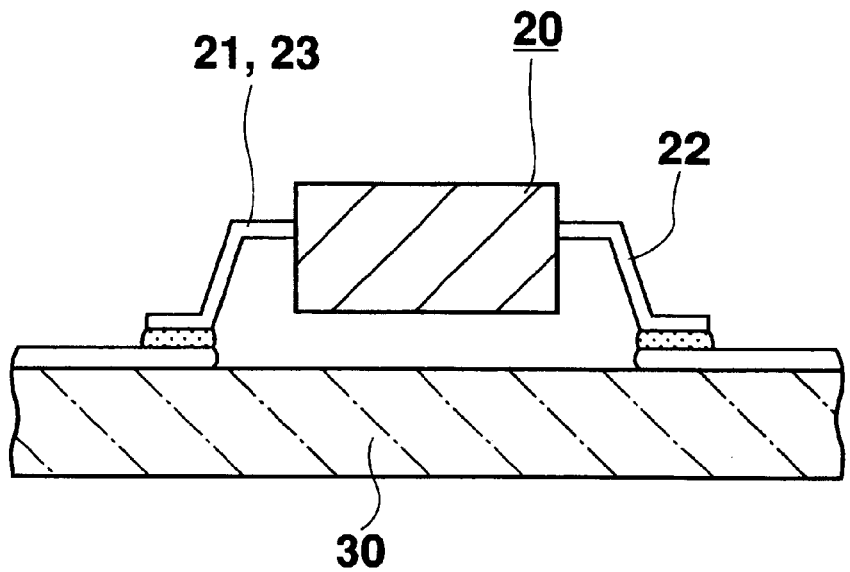
FIG. 2 is a section showing a state of mounting the conventional semiconductor device on a wiring substrate.
Figure 3:
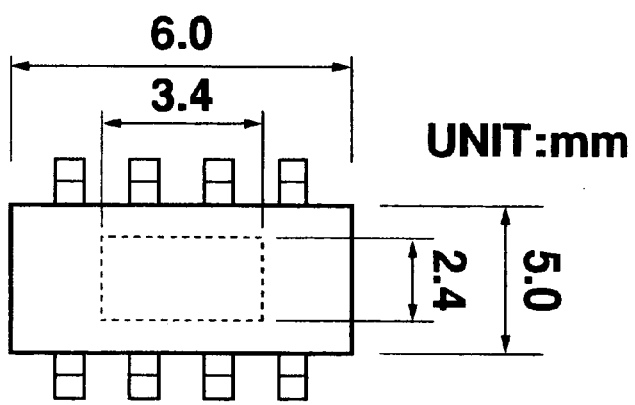
FIG. 3 is a top view of the conventional semiconductor device.
Figure 4:
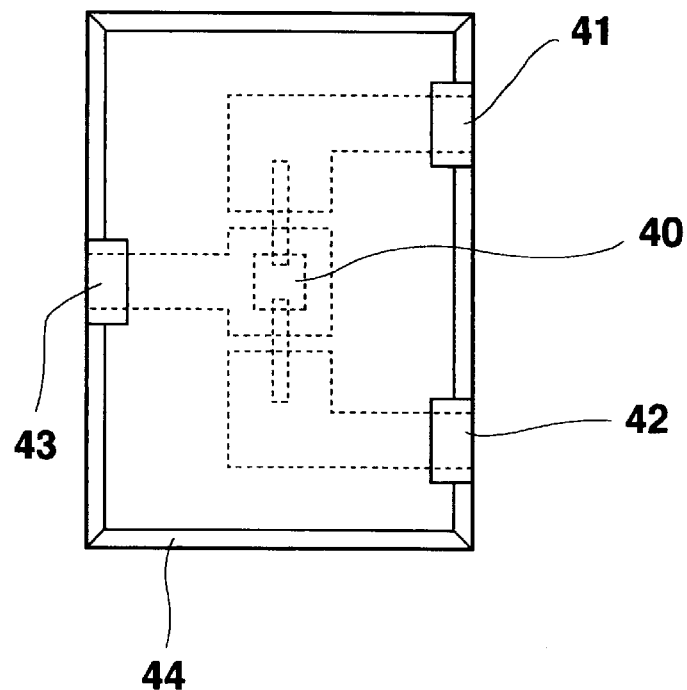
FIG. 4 is a top view of the conventional semiconductor device.
Figure 5:
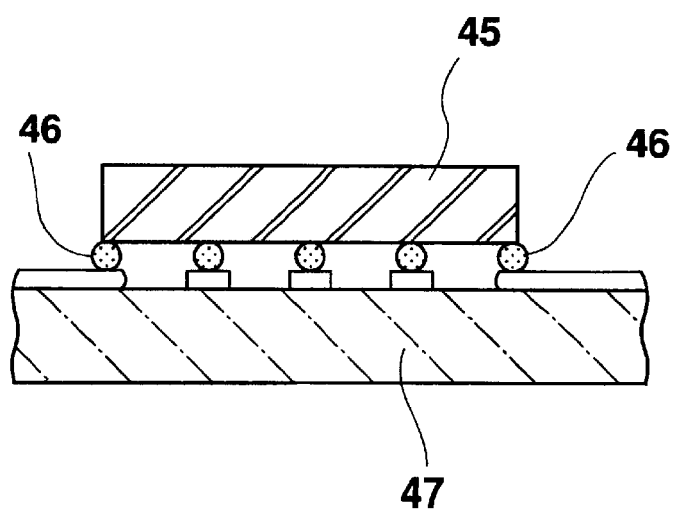
FIG. 5 is an explanatory view of the conventional semiconductor device.
Figure 6:
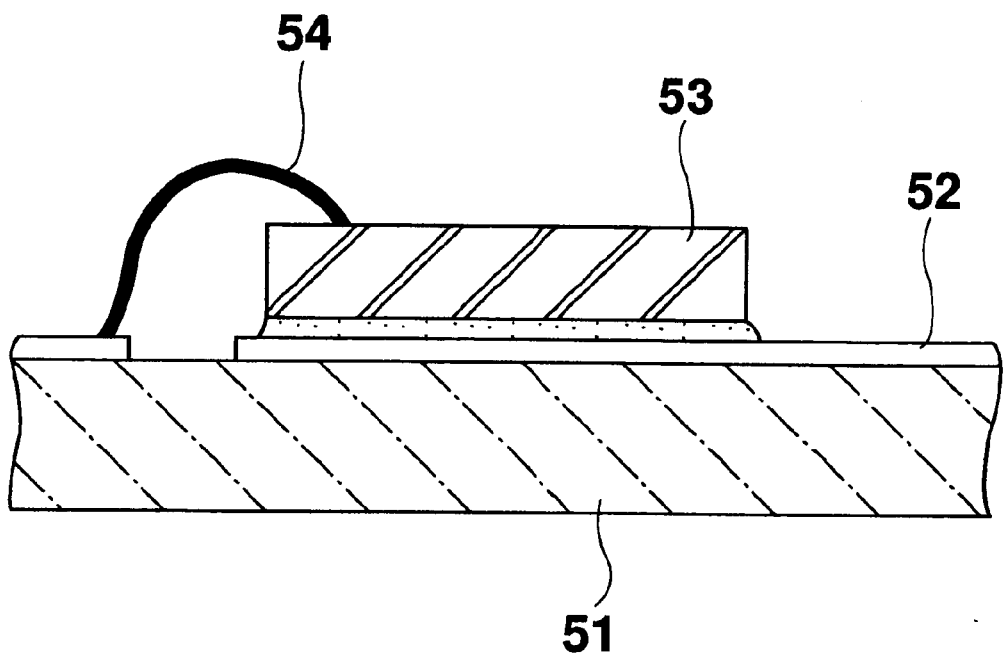
FIG. 6 is an explanatory view of the conventional semiconductor device.
Figure 37:
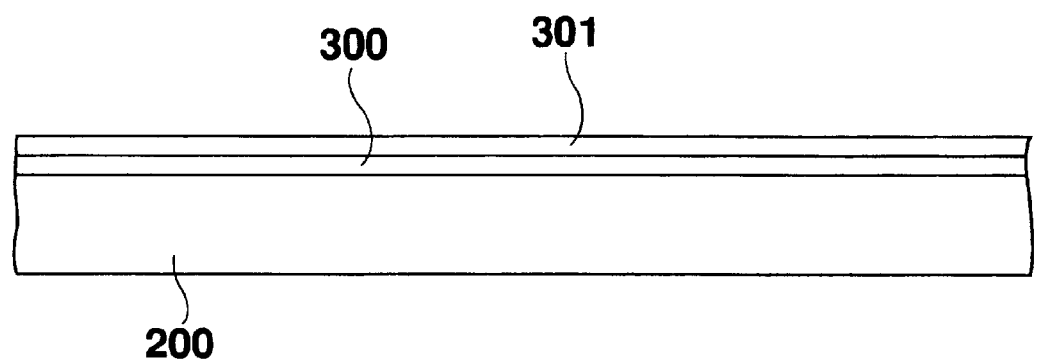
FIG. 37 is a section showing a manufacturing method of a semiconductor device according to a third embodiment of the present invention.
Figure 38:
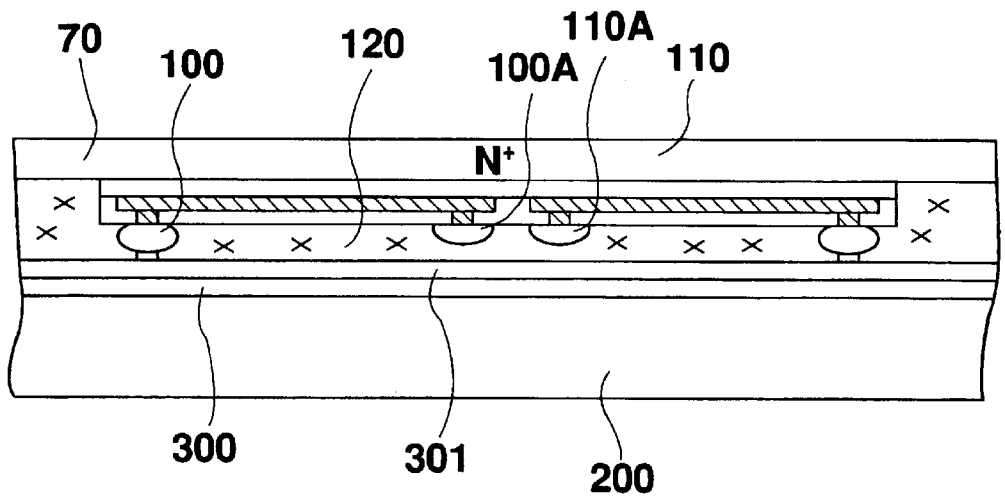
FIG. 38 is a section showing a manufacturing method of the semiconductor device according to the third embodiment of the present invention.

As shown in FIG. 37, copper plate 200 is first prepared and next nickel 300 and gold (Au) 301 are laid over the entire surface. Although two layers are used in this case, more layers may be used, as long as the top layer has a material which can be adhered to the junction layer 92 (see FIG. 10) used for the bump electrode 100 as shown in FIG. 6 and the lowest layer has adhesive materials. In order to avoid film peeling between layers, various materials may be selectively used.

Next, the second semiconductor substrate 110, on which the solder bump electrode 100 is formed, is formed in a similar manner as that given in FIG. 18 of the previous embodiment. The sign 120 is meant for a resin layer and is used for temporarily fastening copper plate at the time of dicing afterward. If bump electrodes 100 and 100A have equal sizes, the bump electrode 100A will be stuck at the same time, thereby making it unable to spear through the copper plate. For the above reason, the size of bump electrode 100A is made small.

Figure 39:
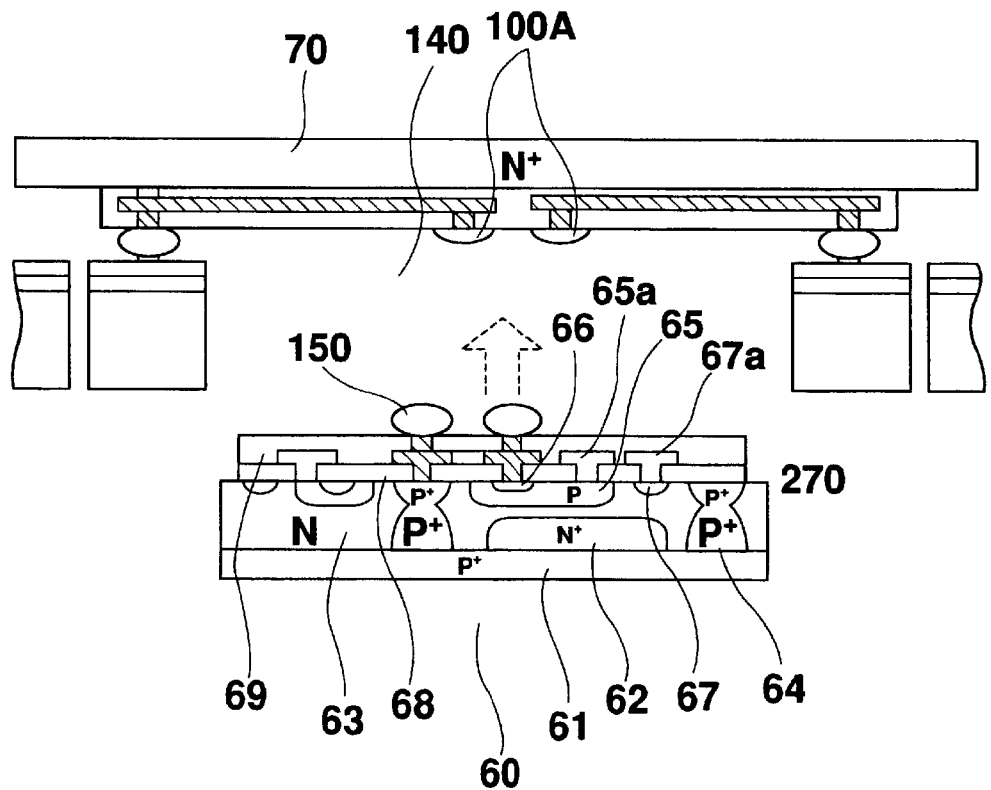
FIG. 39 is a section showing a manufacturing method of the semiconductor device according to the third embodiment of the present invention.

However, if it is desired that the sizes of bump electrodes 100 and 100A be the same, the severing part shown in FIG. 39 should be dented by pressing so that the height of bump electrode 100A is lower than that of bump electrode 100.

Next, as shown in FIG. 39, the storage space 140, which permits grounding of the semiconductor chip 60, is formed through dicing from the back face of the copper plate, the semiconductor chip is stored as the arrow indicates, and bump electrodes 100A and 150 are connected. Here, the back face of semiconductor chip 60 is higher than the back face of copper plate, because a bump electrode 150 is formed in the semiconductor chip in spite of small size of older bump electrode 100A. Therefore in order to match the back aces of the chip 60 and the copper plate, the thickness of the copper plate is adjustment according to the thickness of the bump electrode 150.

Similar to dent formation as mentioned above, the copper plate and the back face of semiconductor chip are leveled with each other by adjustment of the semiconductor chip with the thickness of the copper plate.

As mentioned before, the present invention provides an advantage that the back faces of the semiconductor substrate and external connector electrode are mounted as electrodes.

After this, the process is the same as that already explained using FIG. 29 and later, so this explanation is not repeated here.

In the present invention, although a semiconductor substrate was initially considered for external connector electrode, a copper (Cu) substrate is used due to the issue of resistance value even after diffusing impurity.

As described above, according to the semiconductor device of the present invention, the dimensions of the semiconductor device can be significantly miniaturized, as the need for metal lead terminals, which are connected with the external electrode, and sealing mold for protection as required in conventional semiconductor devices is eliminated. As a result, it is possible to further miniaturize the mounting substrate, as dead space in the mounting area on the mounting substrate can be reduced, significantly enhancing the factor of effective area.

Using the manufacturing method for semiconductor devices in the present invention, semiconductor devices according to the present invention can be manufactured which do not require any sealing mold for protection or metal lead terminals to be connected with external electrodes.

What is claimed is:

1. A semiconductor device manufacturing method comprising the steps of:

preparing an integrated circuit chip having at each side a group of first connector electrodes which are exposed to a surface for the purpose of external connection;

preparing a semiconductor wafer or a metal substrate which can provide a storage space for said integrated circuit chip by providing an excision area extending from a back face to a surface, and providing a slit in a form of grid around said storage space to enable arrangement of a group of external connector electrodes corresponding to said group of first connector electrodes which are located at said each side;

forming said storage space after removing said semiconductor wafer or said metal substrate which is separated by said slit located on the inward side of said group of external connector electrodes; and storing said integrated circuit chip into said storage space and electrically connecting said group of first connector electrodes with said group of external connector electrodes in order to form an integral semiconductor device.

2. A semiconductor device manufacturing method comprising the steps of:

preparing a semiconductor chip having a group of first connector electrodes exposed to a surface for the purpose of external connection;

preparing a metal plate which can provide a storage space for said semiconductor chip by providing an excision area extending from a back face to a surface, and providing a slit in a form of grid around said storage space in order to enable arrangement of a group of electrodes for external connection corresponding to said group of first connector electrodes;

forming said storage space after removing said metal plate which is separated by said slit located on the inward side of said group of electrodes for external connection; and storing said semiconductor chip into said storage space and electrically connecting said group of first connector electrodes with said group of electrodes for external connection in order to form an integral semiconductor device.

3. The semiconductor device manufacturing method according to claim 2, wherein said slit is formed by dicing.

4. A semiconductor device manufacturing method comprising the steps of:

forming an epitaxial layer on a first plane of a first substrate made of a semiconductor material on which a plurality of chip located regions correspond to semiconductor device size;

forming first conductive connectors on the epitaxial layer in each of a plurality of first region on the peripheries of each chip region;

forming a plurality of wiring patterns arranged within an area of the semiconductor device size on a second substrate, a first edge of the wiring patterns provided in an area corresponding to the plurality of the first region of the first substrate, and a second edge of the wiring patterns extended to an area corresponding to the plurality of a second region which is surrounded by the plurality of the first regions and within the chip located region of the first substrate;

forming second conductive connectors on the first and second edge of the wiring patterns;

arranging the first and second substrates such that a space is formed between them and such that the first and the second connectors on the second regions are electrically connected and fixed;

filling insulating resin into the space;

forming external connector electrodes composed of the first substrate in the first regions by forming slits at boundaries of the first regions from a surface of the first substrate and electrically separating the first substrate in the first regions;

forming a storage space for storing a semiconductor chip in the chip located region by removing the first substrate from the chip located region;

locating the semiconductor chip in the chip locating region, and electrically connecting and fixing electrodes formed in the semiconductor chip and the second connectors provided in the second region; and dicing the first and second substrate at the boundary of every the area corresponding to the semiconductor device size and separating the wafers after each semiconductor device.

5. The semiconductor device manufacturing method according to claim 4, wherein the second substrate is a semiconductor substrate.

6. The semiconductor device manufacturing method according to claim 4, wherein the second substrate is a metal substrate.

7. A semiconductor device comprising:

a semiconductor chip comprising an integrated circuit and a plurality of electrodes at its sides;

a plurality of external connector electrodes of a block form and formed by a substrate other than said semiconductor chip arranged around said semiconductor chip in a pattern corresponding to said plurality of electrodes and at intervals from said semiconductor chip;

a wiring substrate arranged face to face with said semiconductor chip and said external connector electrodes, and having on its surface a wiring pattern for electrically connecting said electrodes of said semiconductor chip with said external connector electrodes; and one or more connectors for respectively connecting one edge of said wiring pattern with said electrodes of said semiconductor chip, and the other edge of said wiring pattern with said external connector electrodes.

8. The semiconductor device according to claim 7, wherein the connectors are bump electrodes, by which a space is formed between said semiconductor substrate and said semiconductor chip.

9. The semiconductor device according to claim 7, wherein said connectors have bump electrodes; and connection said wiring pattern with said electrodes of said semiconductor chip and said external connector electrodes is achieved by a plurality of junction layers formed on a surface of said bump electrodes.

10. The semiconductor device according to claim 7, wherein thermohardening insulating resin is filled into a space formed between said semiconductor substrate and said semiconductor chip.

11. The semiconductor device according to claim 8, wherein thermohardening insulating resin is filled into said space.

12. The semiconductor device according to claim 9, wherein thermohardening insulating resin is filled into said space.

13. A semiconductor device comprising:

a semiconductor chip comprising a semiconductor element and an electrode provided on its surface;

an electrode formed by a metal substrate different other than that of said semiconductor chip in a block form for external connection arranged around said semiconductor chip, corresponding to said electrode, and at a regular interval from said semiconductor chip;

a wiring substrate arranged face to face with said semiconductor chip and said electrode for external connection and having on its surface a wiring pattern for electrically connecting said electrode of said semiconductor chip with said electrode for external connection; and one or more connectors for respectively connecting one edge of said wiring pattern with said electrode of said semiconductor chip, and the other edge of said wiring pattern with said electrode for external connection.

14. The semiconductor device according to claim 13, wherein the connectors are bump electrodes and a space is formed between said semiconductor substrate and said semiconductor chip by the bump electrodes.

15. The semiconductor device according to claim 14, wherein connection is performed by a plurality of junction layers formed on surfaces of said bump electrodes.

16. The semiconductor device according to claim 13, wherein thermohardening insulating resin is filled into a space formed between said semiconductor substrate and said semiconductor chip.

17. The semiconductor device according to claim 13, wherein said connectors have bump electrodes and thermohardening resin is filled into a space between said semiconductor substrate and said semiconductor chip, which are kept apart by the bump electrodes.

18. The semiconductor device according to claim 13, wherein, said connectors have bump electrodes; and
connection said wiring pattern with said electrode of said semiconductor chip and said external connector electrodes is achieved by a plurality of junction layers formed on surfaces of said bump electrodes, and thermohardening insulating resin is filled into said space.

19. The semiconductor device according to claim 13, wherein said metal substrate contains copper.

* * * * *

UNITED STATES PATENT AND TRADEMARK OFFICE
CERTIFICATE OF CORRECTION

PATENT NO.   : 6,022,757               Page 1 of 1
DATED        : February 8, 2000
INVENTOR(S)  : Mamoru Andoh It is certified that error appears in the above-identified patent and that said Letters Patent is hereby corrected as shown below:

<u>Column 16,</u>
Line 20, delete "older" and insert therefor -- solder --
Line 21, after "back" delete "aces" and insert therefor -- faces --

<u>Column 18,</u>
Line 35, after "said" delete "semiconductor" and insert therefor -- wiring --
Line 45, after "said" (first occurrence) delete "semiconductor" and insert therefor
-- wiring --

<u>Column 19,</u>
Lines 7 and 14, after "said" (first occurrence) delete "semiconductor" and insert therefor
-- wiring --

Signed and Sealed this

Thirteenth Day of January, 2004

JON W. DUDAS
*Acting Director of the United States Patent and Trademark Office*